(12) United States Patent
Lee et al.

(10) Patent No.: US 8,835,221 B2
(45) Date of Patent: Sep. 16, 2014

(54) INTEGRATED CHIP PACKAGE STRUCTURE USING CERAMIC SUBSTRATE AND METHOD OF MANUFACTURING THE SAME

(71) Applicant: Megica Corporation, Hsin-Chu (TW)

(72) Inventors: Jin-Yaun Lee, Hsinchu (TW);
Mou-Shiung Lin, Hsinchu (TW);
Ching-Cheng Huang, Hsinchu (TW)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/887,093

(22) Filed: May 3, 2013

(65) Prior Publication Data

US 2013/0309812 A1 Nov. 21, 2013

Related U.S. Application Data

(62) Division of application No. 10/454,972, filed on Jun. 4, 2003, now Pat. No. 8,535,976, which is a division of application No. 10/055,498, filed on Jan. 22, 2002, now Pat. No. 6,800,941.

(30) Foreign Application Priority Data

Dec. 31, 2001 (TW) ............................... 90133092 A

(51) Int. Cl.
*H01L 21/44* (2006.01)
*H01L 23/00* (2006.01)
*H01L 23/498* (2006.01)
*H01L 23/538* (2006.01)

(52) U.S. Cl.
CPC ....... *H01L 24/82* (2013.01); *H01L 2924/01013* (2013.01); *H01L 2924/01079* (2013.01); *H01L 2224/97* (2013.01); *H01L 2924/01029* (2013.01); *H01L 2224/20* (2013.01); *H01L 2924/19043* (2013.01); *H01L 23/49822* (2013.01); *H01L 2924/01005* (2013.01); *H01L 2924/09701* (2013.01); *H01L 24/19* (2013.01); *H01L 2221/68377* (2013.01); *H01L 2224/04105* (2013.01); *H01L 2224/211* (2013.01); *H01L 23/5389* (2013.01); *H01L 2924/01078* (2013.01); *H01L 2924/01033* (2013.01); *H01L 2924/15311* (2013.01); *H01L 2924/15174* (2013.01); *H01L 2224/13022* (2013.01); *H01L 2924/19041* (2013.01); *H01L 24/97* (2013.01); *H01L 2924/19042* (2013.01); *H01L 2924/01006* (2013.01); *H01L 23/49894* (2013.01); *H01L 2924/14* (2013.01); *H01L 2924/01027* (2013.01)

USPC ........... 438/107; 438/108; 438/113; 438/125; 438/459

(58) Field of Classification Search
USPC ......... 438/107, 108, 110–113, 118, 125, 458, 438/459; 257/777, 778
See application file for complete search history.

(56) References Cited

U.S. PATENT DOCUMENTS

| | | |
|---|---|---|
| 2,920,232 A | 1/1960 | Joseph |
| 3,504,214 A | 3/1970 | Lake |
| 3,634,714 A | 1/1972 | Anderson et al. |
| 3,677,112 A | 7/1972 | Keniston |
| 3,903,590 A | 9/1975 | Yokogawa |
| 4,021,838 A | 5/1977 | Warwick |
| 4,235,498 A | 11/1980 | Snyder |
| 4,402,888 A | 9/1983 | Runck |
| 4,622,058 A | 11/1986 | Leary-Renick et al. |
| 4,685,998 A | 8/1987 | Quinn et al. |
| 4,789,647 A | 12/1988 | Peters |
| 4,840,923 A | 6/1989 | Flagello et al. |
| 4,866,501 A | 9/1989 | Shanefield |
| 4,918,811 A | 4/1990 | Eichelberger et al. |
| 5,048,179 A | 9/1991 | Shindo et al. |
| 5,049,980 A | 9/1991 | Saito et al. |
| 5,055,321 A | 10/1991 | Enomoto et al. |
| 5,063,177 A | 11/1991 | Geller et al. |
| 5,073,814 A | 12/1991 | Cole, Jr. et al. |
| 5,081,563 A | 1/1992 | Feng et al. |
| 5,083,187 A | 1/1992 | Lamson et al. |
| 5,095,402 A | 3/1992 | Hernandez et al. |
| 5,099,306 A | 3/1992 | Dunaway et al. |

| Patent No. | Date | Inventor(s) | | Patent No. | Date | Inventor(s) |
|---|---|---|---|---|---|---|
| 5,111,278 A | 5/1992 | Eichelberger | | 5,874,770 A | 2/1999 | Saia et al. |
| 5,149,662 A | 9/1992 | Eichelberger | | 5,875,545 A | 3/1999 | DiStefano et al. |
| 5,161,093 A | 11/1992 | Gorczyca et al. | | 5,883,435 A | 3/1999 | Geffken et al. |
| 5,188,984 A | 2/1993 | Nishiguchi | | 5,892,273 A | 4/1999 | Iwasaki et al. |
| 5,196,377 A | 3/1993 | Wagner et al. | | 5,892,288 A | 4/1999 | Muraki et al. |
| 5,211,278 A | 5/1993 | Mendenhall | | 5,919,548 A | 7/1999 | Barron et al. |
| 5,226,232 A | 7/1993 | Boyd | | 5,929,510 A | 7/1999 | Geller et al. |
| 5,239,198 A | 8/1993 | Lin et al. | | 5,932,379 A | 8/1999 | Burm et al. |
| 5,241,456 A | 8/1993 | Marcinkiewicz et al. | | 5,939,214 A | 8/1999 | Mahulikar et al. |
| 5,250,843 A | 10/1993 | Eichelberger | | 5,939,782 A | 8/1999 | Malladi |
| 5,281,151 A | 1/1994 | Arima et al. | | 5,945,741 A | 8/1999 | Ohsawa et al. |
| 5,291,066 A | 3/1994 | Neugebauer et al. | | 5,952,726 A | 9/1999 | Liang |
| 5,300,812 A | 4/1994 | Lupinski et al. | | 5,959,357 A | 9/1999 | Korman |
| 5,324,687 A | 6/1994 | Wojnarowski | | 5,973,908 A | 10/1999 | Saia et al. |
| 5,331,204 A | 7/1994 | Kuroda et al. | | 5,994,766 A | 11/1999 | Shenoy et al. |
| 5,334,874 A | 8/1994 | Metzler et al. | | 6,002,592 A | 12/1999 | Nakamura et al. |
| 5,336,928 A | 8/1994 | Neugebauer et al. | | 6,004,867 A * | 12/1999 | Kim et al. ..................... 438/459 |
| 5,353,195 A | 10/1994 | Fillion et al. | | 6,008,070 A | 12/1999 | Farnworth |
| 5,353,498 A | 10/1994 | Fillion et al. | | 6,008,102 A | 12/1999 | Alford et al. |
| 5,359,496 A | 10/1994 | Kornrumpf et al. | | 6,010,956 A | 1/2000 | Takiguchi et al. |
| 5,365,790 A | 11/1994 | Chen et al. | | 6,011,314 A | 1/2000 | Leibovitz et al. |
| 5,366,906 A | 11/1994 | Wojnarowski et al. | | 6,013,948 A | 1/2000 | Akram et al. |
| 5,370,766 A | 12/1994 | Desaigoudar et al. | | 6,018,463 A | 1/2000 | Winslow et al. |
| 5,372,967 A | 12/1994 | Sundaram et al. | | 6,020,220 A | 2/2000 | Gilleo et al. |
| 5,384,488 A | 1/1995 | Golshan et al. | | 6,022,792 A | 2/2000 | Ishii et al. |
| 5,388,328 A | 2/1995 | Yokono et al. | | 6,025,995 A | 2/2000 | Marcinkiewicz |
| 5,394,490 A | 2/1995 | Kato et al. | | 6,030,856 A | 2/2000 | DiStefano et al. |
| 5,401,687 A | 3/1995 | Cole et al. | | 6,033,939 A | 3/2000 | Agarwala et al. |
| 5,416,356 A | 5/1995 | Staudinger et al. | | 6,043,109 A | 3/2000 | Yang et al. |
| 5,422,513 A | 6/1995 | Marcinkiewicz et al. | | 6,045,655 A | 4/2000 | DiStefano et al. |
| 5,432,675 A | 7/1995 | Sorimachi et al. | | 6,046,076 A | 4/2000 | Mitchell et al. |
| 5,432,677 A | 7/1995 | Mowatt et al. | | 6,077,726 A | 6/2000 | Mistry et al. |
| 5,434,751 A | 7/1995 | Cole, Jr. et al. | | 6,078,104 A | 6/2000 | Sakurai |
| 5,450,101 A | 9/1995 | Ishida et al. | | 6,080,605 A | 6/2000 | Distefano et al. |
| 5,478,773 A | 12/1995 | Dow et al. | | 6,087,199 A | 7/2000 | Pogge et al. |
| 5,483,421 A | 1/1996 | Gedney et al. | | 6,087,648 A | 7/2000 | Zhang et al. |
| 5,524,339 A | 6/1996 | Gorowitz et al. | | 6,093,584 A | 7/2000 | Fjelstad |
| 5,532,512 A | 7/1996 | Fillion et al. | | 6,104,091 A | 8/2000 | Ito et al. |
| 5,534,727 A | 7/1996 | Inoue | | 6,107,123 A | 8/2000 | DiStefano et al. |
| 5,541,442 A | 7/1996 | Keil et al. | | 6,110,806 A * | 8/2000 | Pogge ........................ 438/458 |
| 5,548,091 A | 8/1996 | DiStefano et al. | | 6,121,688 A | 9/2000 | Akagawa |
| 5,548,099 A | 8/1996 | Cole, Jr. et al. | | 6,125,039 A | 9/2000 | Suzuki |
| 5,565,706 A | 10/1996 | Miura et al. | | 6,126,428 A | 10/2000 | Mitchell et al. |
| 5,566,441 A | 10/1996 | Marsh et al. | | 6,130,116 A | 10/2000 | Smith et al. |
| 5,576,517 A | 11/1996 | Wojnarowski et al. | | 6,139,666 A | 10/2000 | Fasano et al. |
| 5,583,359 A | 12/1996 | Ng et al. | | 6,144,100 A | 11/2000 | Shen et al. |
| 5,602,059 A | 2/1997 | Horiuchi et al. | | 6,150,716 A | 11/2000 | MacQuarrie et al. |
| 5,606,198 A | 2/1997 | Ono et al. | | 6,154,366 A | 11/2000 | Ma et al. |
| 5,611,884 A | 3/1997 | Bearinger et al. | | 6,159,767 A | 12/2000 | Eichelberger |
| 5,629,240 A | 5/1997 | Malladi et al. | | 6,163,456 A | 12/2000 | Suzuki et al. |
| 5,635,762 A | 6/1997 | Gamand | | 6,168,965 B1 | 1/2001 | Malinovich et al. |
| 5,648,448 A | 7/1997 | Marrocco, III | | 6,169,319 B1 | 1/2001 | Malinovich et al. |
| 5,650,662 A | 7/1997 | Edwards et al. | | 6,175,161 B1 | 1/2001 | Goetz et al. |
| 5,659,201 A | 8/1997 | Wollesen | | 6,177,293 B1 | 1/2001 | Netzer et al. |
| 5,663,106 A | 9/1997 | Karavakis et al. | | 6,180,445 B1 | 1/2001 | Tsai |
| 5,665,989 A | 9/1997 | Dangelo | | 6,184,143 B1 | 2/2001 | Ohashi et al. |
| 5,668,399 A | 9/1997 | Cronin et al. | | 6,187,615 B1 | 2/2001 | Kim et al. |
| 5,691,248 A | 11/1997 | Cronin et al. | | 6,187,680 B1 | 2/2001 | Costrini et al. |
| 5,696,466 A | 12/1997 | Li | | 6,202,299 B1 | 3/2001 | DiStefano et al. |
| 5,717,245 A | 2/1998 | Pedder | | 6,204,091 B1 | 3/2001 | Smith et al. |
| 5,729,053 A | 3/1998 | Orthmann | | 6,205,032 B1 | 3/2001 | Shepherd |
| 5,745,984 A | 5/1998 | Cole, Jr. et al. | | 6,218,215 B1 | 4/2001 | DiStefano et al. |
| 5,757,072 A | 5/1998 | Gorowitz et al. | | 6,221,687 B1 | 4/2001 | Abramovich |
| 5,757,079 A | 5/1998 | McAllister et al. | | 6,225,013 B1 | 5/2001 | Cohen et al. |
| 5,763,108 A | 6/1998 | Chang et al. | | 6,225,692 B1 | 5/2001 | Hinds |
| 5,767,564 A | 6/1998 | Kunimatsu et al. | | 6,228,684 B1 | 5/2001 | Maruyama |
| 5,776,796 A | 7/1998 | Distefano et al. | | 6,228,687 B1 | 5/2001 | Akram et al. |
| 5,786,239 A | 7/1998 | Ohsawa et al. | | 6,229,203 B1 | 5/2001 | Wojnarowski |
| 5,789,303 A | 8/1998 | Leung et al. | | 6,232,152 B1 | 5/2001 | DiStefano et al. |
| 5,792,594 A | 8/1998 | Brown et al. | | 6,235,552 B1 | 5/2001 | Kwon et al. |
| 5,817,541 A | 10/1998 | Averkiou et al. | | 6,236,098 B1 | 5/2001 | Efland et al. |
| 5,834,339 A | 11/1998 | Distefano et al. | | 6,236,101 B1 | 5/2001 | Erdeljac et al. |
| 5,834,832 A | 11/1998 | Kweon et al. | | 6,239,482 B1 | 5/2001 | Fillion et al. |
| 5,834,844 A | 11/1998 | Akagawa et al. | | 6,239,980 B1 | 5/2001 | Fillion et al. |
| 5,841,193 A | 11/1998 | Eichelberger | | 6,242,282 B1 | 6/2001 | Fillion et al. |
| 5,852,391 A | 12/1998 | Watanabe et al. | | 6,242,987 B1 | 6/2001 | Schopf et al. |
| 5,854,001 A | 12/1998 | Casey et al. | | 6,245,595 B1 | 6/2001 | Nguyen et al. |
| 5,854,513 A | 12/1998 | Kim | | 6,255,738 B1 | 7/2001 | DiStefano et al. |
| 5,872,489 A | 2/1999 | Chang et al. | | 6,258,631 B1 | 7/2001 | Ito et al. |

| | | |
|---|---|---|
| 6,271,469 B1 | 8/2001 | Ma et al. |
| 6,274,391 B1 | 8/2001 | Wachtler et al. |
| 6,277,669 B1 | 8/2001 | Kung et al. |
| 6,278,264 B1 | 8/2001 | Burstein et al. |
| 6,281,583 B1 | 8/2001 | Dirahoui et al. |
| 6,284,573 B1 | 9/2001 | Farnworth |
| 6,285,065 B1 | 9/2001 | Levy |
| 6,287,893 B1 | 9/2001 | Elenius et al. |
| 6,288,434 B1 | 9/2001 | Levy |
| 6,288,447 B1 | 9/2001 | Amishiro et al. |
| 6,288,905 B1 | 9/2001 | Chung |
| 6,291,884 B1 | 9/2001 | Glenn et al. |
| 6,294,040 B1 | 9/2001 | Raab et al. |
| 6,294,741 B1 | 9/2001 | Cole, Jr. et al. |
| 6,303,423 B1 | 10/2001 | Lin |
| 6,309,915 B1 | 10/2001 | DiStefano |
| 6,313,528 B1 | 11/2001 | Solberg |
| 6,319,827 B1 | 11/2001 | Kowalski et al. |
| 6,320,753 B1 | 11/2001 | Launay |
| 6,323,096 B1 | 11/2001 | Saia et al. |
| 6,326,697 B1 | 12/2001 | Farnworth |
| 6,329,224 B1 | 12/2001 | Nguyen et al. |
| 6,329,713 B1 | 12/2001 | Farquhar et al. |
| 6,331,481 B1 | 12/2001 | Stamper et al. |
| 6,333,557 B1 | 12/2001 | Sullivan |
| 6,344,401 B1 | 2/2002 | Lam |
| 6,348,728 B1 | 2/2002 | Aiba et al. |
| 6,356,453 B1 | 3/2002 | Juskey et al. |
| 6,359,320 B1 | 3/2002 | Yamazaki et al. |
| 6,359,328 B1 | 3/2002 | Dubin |
| 6,359,335 B1 | 3/2002 | Distefano et al. |
| 6,362,087 B1 | 3/2002 | Wang et al. |
| 6,362,498 B2 | 3/2002 | Abramovich |
| 6,365,498 B1 | 4/2002 | Chu et al. |
| 6,373,141 B1 | 4/2002 | DiStefano et al. |
| 6,383,858 B1 | 5/2002 | Gupta et al. |
| 6,383,916 B1 | 5/2002 | Lin |
| 6,384,473 B1 | 5/2002 | Peterson et al. |
| 6,388,340 B2 | 5/2002 | Distefano |
| 6,395,580 B1 | 5/2002 | Tseng |
| 6,396,148 B1 | 5/2002 | Eichelberger et al. |
| 6,400,573 B1 | 6/2002 | Mowatt et al. |
| 6,423,570 B1 | 7/2002 | Ma et al. |
| 6,424,034 B1 | 7/2002 | Ahn et al. |
| 6,428,377 B1 | 8/2002 | Choi |
| 6,429,036 B1 | 8/2002 | Nixon et al. |
| 6,429,120 B1 | 8/2002 | Ahn et al. |
| 6,439,728 B1 | 8/2002 | Copeland |
| 6,440,834 B2 | 8/2002 | Daubenspeck et al. |
| 6,441,715 B1 | 8/2002 | Johnson |
| 6,445,064 B1 | 9/2002 | Ishii et al. |
| 6,458,681 B1 | 10/2002 | DiStefano et al. |
| 6,459,135 B1 | 10/2002 | Basteres et al. |
| 6,460,245 B1 | 10/2002 | DiStefano |
| 6,462,424 B1 | 10/2002 | Seki et al. |
| 6,472,745 B1 | 10/2002 | Iizuka |
| 6,482,730 B1 | 11/2002 | Masumoto et al. |
| 6,486,005 B1 | 11/2002 | Kim |
| 6,486,535 B2 | 11/2002 | Liu |
| 6,492,723 B2 | 12/2002 | Suyama |
| 6,492,829 B1 | 12/2002 | Miura et al. |
| 6,495,914 B1 * | 12/2002 | Sekine et al. .................. 257/723 |
| 6,496,240 B1 | 12/2002 | Zhang et al. |
| 6,501,169 B1 | 12/2002 | Aoki et al. |
| 6,504,227 B1 | 1/2003 | Matsuo et al. |
| 6,507,102 B2 | 1/2003 | Juskey et al. |
| 6,521,996 B1 | 2/2003 | Seshan |
| 6,537,584 B1 | 3/2003 | Zentner et al. |
| 6,538,210 B2 | 3/2003 | Sugaya et al. |
| 6,541,872 B1 | 4/2003 | Schrock et al. |
| 6,545,354 B1 | 4/2003 | Aoki et al. |
| 6,546,620 B1 | 4/2003 | Juskey et al. |
| 6,548,891 B2 | 4/2003 | Mashino |
| 6,555,469 B1 | 4/2003 | MacIntyre |
| 6,555,906 B2 | 4/2003 | Towle et al. |
| 6,555,908 B1 | 4/2003 | Eichelberger et al. |
| 6,558,976 B2 | 5/2003 | Shrauger |
| 6,559,528 B2 | 5/2003 | Watase et al. |
| 6,563,106 B1 | 5/2003 | Bowers et al. |
| 6,582,991 B1 | 6/2003 | Maeda et al. |
| 6,590,291 B1 | 7/2003 | Akagawa |
| 6,602,740 B1 | 8/2003 | Mitchell |
| 6,603,072 B1 | 8/2003 | Foster et al. |
| 6,610,621 B2 | 8/2003 | Masuko |
| 6,610,934 B2 | 8/2003 | Yamaguchi et al. |
| 6,614,091 B1 | 9/2003 | Downey et al. |
| 6,614,110 B1 | 9/2003 | Pace |
| 6,617,174 B2 | 9/2003 | Rotstein |
| 6,620,513 B2 | 9/2003 | Yuyama et al. |
| 6,625,028 B1 | 9/2003 | Dove et al. |
| 6,625,037 B2 | 9/2003 | Nakatani et al. |
| 6,633,005 B2 | 10/2003 | Ichitsubo et al. |
| 6,639,299 B2 | 10/2003 | Aoki |
| 6,639,324 B1 | 10/2003 | Chien |
| 6,646,347 B2 | 11/2003 | Mercado et al. |
| 6,653,172 B2 | 11/2003 | DiStefano et al. |
| 6,653,563 B2 | 11/2003 | Bohr |
| 6,657,228 B2 | 12/2003 | Ohtani |
| 6,657,310 B2 | 12/2003 | Lin |
| 6,673,698 B1 | 1/2004 | Lin et al. |
| 6,680,544 B2 | 1/2004 | Lu et al. |
| 6,683,380 B2 | 1/2004 | Efland et al. |
| 6,686,015 B2 | 2/2004 | Raab et al. |
| 6,690,845 B1 | 2/2004 | Yoshimura et al. |
| 6,707,124 B2 | 3/2004 | Wachtler et al. |
| 6,710,454 B1 | 3/2004 | Boon |
| 6,713,589 B2 | 3/2004 | Sue et al. |
| 6,730,857 B2 | 5/2004 | Konrad et al. |
| 6,734,534 B1 | 5/2004 | Vu et al. |
| 6,737,750 B1 | 5/2004 | Hoffman et al. |
| 6,746,898 B2 | 6/2004 | Lin et al. |
| 6,759,273 B2 | 7/2004 | Felton et al. |
| 6,765,299 B2 | 7/2004 | Takahashi et al. |
| 6,777,819 B2 | 8/2004 | Huang |
| 6,780,747 B2 | 8/2004 | Distefano et al. |
| 6,780,748 B2 | 8/2004 | Yamaguchi et al. |
| 6,794,273 B2 | 9/2004 | Saito et al. |
| 6,794,739 B2 | 9/2004 | Kobayashi et al. |
| 6,797,544 B2 | 9/2004 | Ozono et al. |
| 6,800,941 B2 | 10/2004 | Lee et al. |
| 6,806,536 B2 | 10/2004 | Gris |
| 6,838,750 B2 | 1/2005 | Nuytkens et al. |
| 6,841,862 B2 | 1/2005 | Kikuchi et al. |
| 6,847,066 B2 | 1/2005 | Tahara et al. |
| 6,852,616 B2 | 2/2005 | Sahara et al. |
| 6,861,740 B2 | 3/2005 | Hsu |
| 6,867,499 B1 | 3/2005 | Tabrizi |
| 6,885,107 B2 | 4/2005 | Kinsman |
| 6,914,331 B2 | 7/2005 | Shimoishizaka et al. |
| 6,933,601 B2 | 8/2005 | Satoh et al. |
| 6,943,440 B2 | 9/2005 | Kim et al. |
| 6,952,049 B1 | 10/2005 | Ogawa et al. |
| 6,963,136 B2 | 11/2005 | Shinozaki et al. |
| 6,973,709 B2 | 12/2005 | Huang |
| 6,975,516 B2 | 12/2005 | Asahi et al. |
| 6,989,600 B2 | 1/2006 | Kubo et al. |
| 7,067,926 B2 | 6/2006 | Yamazaki et al. |
| 7,071,024 B2 | 7/2006 | Towle et al. |
| 7,087,460 B2 | 8/2006 | Lee |
| 7,094,630 B2 * | 8/2006 | Tomita et al. .................. 438/108 |
| 7,115,488 B2 | 10/2006 | Isobe et al. |
| 7,172,922 B2 | 2/2007 | Benjamin et al. |
| 7,220,667 B2 | 5/2007 | Yamagata |
| 7,239,028 B2 | 7/2007 | Anzai |
| 7,271,033 B2 | 9/2007 | Lin et al. |
| 7,272,888 B2 | 9/2007 | DiStefano |
| 7,294,905 B2 | 11/2007 | Ogino et al. |
| 7,297,614 B2 | 11/2007 | Lee et al. |
| 7,342,258 B2 | 3/2008 | Yamazaki et al. |
| 7,345,365 B2 | 3/2008 | Lee et al. |
| 7,365,273 B2 | 4/2008 | Fairchild et al. |
| 7,397,117 B2 | 7/2008 | Lin et al. |
| 7,413,929 B2 | 8/2008 | Lee et al. |
| 7,417,865 B2 | 8/2008 | Kim |
| 7,449,412 B2 | 11/2008 | Nuytkens et al. |
| 7,454,834 B2 | 11/2008 | DiStefano |
| 7,470,865 B2 | 12/2008 | Fushie et al. |
| 7,511,376 B2 | 3/2009 | Lin et al. |

| | | |
|---|---|---|
| 7,545,044 B2 | 6/2009 | Shibayama et al. |
| 7,653,371 B2 | 1/2010 | Floyd |
| 7,657,242 B2 | 2/2010 | Floyd |
| 7,678,695 B2 | 3/2010 | Taniguchi et al. |
| 7,786,002 B2 | 8/2010 | Leib et al. |
| 7,787,130 B2 | 8/2010 | Webster |
| 7,830,588 B2 | 11/2010 | Miles |
| 7,839,356 B2 | 11/2010 | Hagood et al. |
| 7,848,004 B2 | 12/2010 | Miles |
| 7,863,524 B2 | 1/2011 | Shioga et al. |
| 7,881,686 B2 | 2/2011 | Floyd |
| 7,898,058 B2 | 3/2011 | Lin et al. |
| 7,977,763 B2 | 7/2011 | Lin et al. |
| 8,022,551 B2 | 9/2011 | Soga et al. |
| 8,119,446 B2 | 2/2012 | Lin et al. |
| 8,471,361 B2 | 6/2013 | Lee et al. |
| 8,492,870 B2 | 7/2013 | Lin et al. |
| 8,535,976 B2 | 9/2013 | Lee et al. |
| 2001/0002064 A1 | 5/2001 | Miyazaki et al. |
| 2001/0013653 A1 | 8/2001 | Shoji |
| 2001/0015497 A1 | 8/2001 | Zhao et al. |
| 2001/0021541 A1 | 9/2001 | Akram et al. |
| 2001/0026010 A1 | 10/2001 | Horiuchi et al. |
| 2001/0026435 A1 | 10/2001 | Sakai |
| 2001/0028098 A1 | 10/2001 | Liou |
| 2001/0031514 A1 | 10/2001 | Smith |
| 2001/0033021 A1 | 10/2001 | Shimoishizaka et al. |
| 2001/0033474 A1 | 10/2001 | Sakai et al. |
| 2001/0037863 A1 | 11/2001 | Carson et al. |
| 2001/0040282 A1 | 11/2001 | Corisis et al. |
| 2001/0042901 A1 | 11/2001 | Maruyama |
| 2001/0051426 A1 | 12/2001 | Pozder et al. |
| 2002/0001966 A1 | 1/2002 | Ito et al. |
| 2002/0004288 A1 | 1/2002 | Nishiyama |
| 2002/0020898 A1 | 2/2002 | Vu et al. |
| 2002/0030273 A1 | 3/2002 | Iwamoto et al. |
| 2002/0063304 A1 | 5/2002 | Toeda et al. |
| 2002/0070443 A1 | 6/2002 | Mu et al. |
| 2002/0079575 A1 | 6/2002 | Hozoji et al. |
| 2002/0084510 A1 | 7/2002 | Jun et al. |
| 2002/0121689 A1 | 9/2002 | Honda |
| 2002/0127771 A1 | 9/2002 | Akram et al. |
| 2002/0133943 A1 | 9/2002 | Sakamoto et al. |
| 2002/0135063 A1 | 9/2002 | Alcoe et al. |
| 2002/0137263 A1 | 9/2002 | Towle et al. |
| 2002/0142521 A1 | 10/2002 | Steffens |
| 2002/0158334 A1 | 10/2002 | Vu et al. |
| 2002/0159242 A1 | 10/2002 | Nakatani et al. |
| 2002/0168797 A1 | 11/2002 | DiStefano et al. |
| 2002/0180041 A1 | 12/2002 | Sahara et al. |
| 2003/0020180 A1 | 1/2003 | Ahn et al. |
| 2003/0038331 A1 | 2/2003 | Aoki et al. |
| 2003/0080437 A1 | 5/2003 | Gonzalez et al. |
| 2003/0118738 A1 | 6/2003 | Shuy et al. |
| 2003/0122246 A1 | 7/2003 | Lin et al. |
| 2003/0134455 A1 | 7/2003 | Cheng et al. |
| 2003/0201534 A1 | 10/2003 | Eichelberger et al. |
| 2003/0201548 A1 | 10/2003 | Ikezawa et al. |
| 2003/0218246 A1 | 11/2003 | Abe et al. |
| 2003/0224613 A1 | 12/2003 | Ramanathan et al. |
| 2004/0009629 A1 | 1/2004 | Ahn et al. |
| 2004/0023450 A1 | 2/2004 | Katagiri et al. |
| 2004/0040740 A1* | 3/2004 | Nakatani et al. ............... 174/256 |
| 2004/0063249 A1 | 4/2004 | Lin et al. |
| 2004/0084741 A1 | 5/2004 | Boon et al. |
| 2004/0094841 A1 | 5/2004 | Matsuzaki et al. |
| 2004/0113245 A1 | 6/2004 | Takaoka et al. |
| 2004/0125579 A1 | 7/2004 | Konishi et al. |
| 2004/0140556 A1 | 7/2004 | Lin et al. |
| 2004/0140559 A1 | 7/2004 | Goller et al. |
| 2004/0168825 A1 | 9/2004 | Sakamoto et al. |
| 2005/0070085 A1 | 3/2005 | Huang et al. |
| 2005/0116322 A1 | 6/2005 | Sando et al. |
| 2005/0184358 A1 | 8/2005 | Lin |
| 2005/0208757 A1 | 9/2005 | Lin |
| 2005/0218515 A1 | 10/2005 | Kweon et al. |
| 2006/0001152 A1 | 1/2006 | Hu |
| 2006/0228272 A1 | 10/2006 | Watson et al. |
| 2006/0244137 A1 | 11/2006 | Kikuchi et al. |

FOREIGN PATENT DOCUMENTS

| | | |
|---|---|---|
| EP | 1094511 A2 | 4/2001 |
| JP | 360004253 | 1/1985 |
| JP | 5114665 | 5/1993 |
| JP | 09260581 | 10/1997 |
| JP | 2000003985 A | 1/2000 |
| TW | 241438 | 2/1995 |
| TW | 385509 B | 3/2000 |
| TW | 403980 B | 9/2000 |
| TW | 417265 B | 1/2001 |
| TW | 423127 B | 2/2001 |
| TW | 423132 B | 2/2001 |
| TW | 444370 B | 7/2001 |
| TW | 449894 B | 8/2001 |
| TW | 452930 B | 9/2001 |
| TW | 454318 B | 9/2001 |
| TW | 456006 B | 9/2001 |
| TW | 457662 B | 10/2001 |
| TW | 457830 B | 10/2001 |
| TW | 463274 B | 11/2001 |
| TW | 466652 B | 12/2001 |
| TW | 466725 B | 12/2001 |
| TW | 469549 B | 12/2001 |
| TW | 531854 B | 5/2003 |
| TW | 90123655 | 5/2003 |

OTHER PUBLICATIONS

Bohr M., "The New Era of Scaling in an SoC World," International Solid-State Circuits Conference, 2009, pp. 23-28.

Bohr M., "The New Era of Scaling in an SoC World," International Solid-State Circuits Conference (2009) Presentation Slides 1-66.

ROC Cancellation Case No. 090131210N01 Third Supplemental Cancellation Brief filed by ACE on May 13, 2010, with English Translated Summary.

Edelstein D., et al., "Full Copper Wiring in a Sub-0.25 pm CMOS ULS Technology," Technical Digest IEEE International Electron Devices Meeting, 1997, pp. 773-776.

Edelstein D.C., "Advantages of Copper Interconnects," Proceedings of the 12th International IEEE VLSI Multilevel Interconnection Conference, 1995, pp. 301-307.

Electronic Materials Handbook, vol. 1—Packaging: Other Design Considerations; Materials and Electronic Phenomena; Physical Characteristics of Microelectronic Materials, ASM International Handbook Committee, pp. 104-111, ASM International (1989).

Emery R.M., et al., "Novel Microelectronic Packaging Method for Reduced Thermomechanical Stresses on Low Dielectric Constant Materials," Intel Corporation, 2007, Chandler, AZ.

Gao X., et al., "An Improved Electrostatic Discharge Protection Structure for Reducing Triggering Voltage and Parasitic Capacitance," Solid-State Electronics, 2003, pp. 1105-1110.

Geffken R.M., "An Overview of Polyimide Use in Integrated Circuits and Packaging," Proceedings of the Third International Symposium on Ultra Large Scale Integration Science and Technology, 1991, pp. 667-677.

Groves R., et al., "High Q Inductors in a SiGe BiCMOS Process Utilizing Thick Metal Process Add-on Module," Proceedings of the Bipolar/BiCMOS Circuits and Technology Meeting, 1999, pp. 149-152.

Hu C.K., et al., "Copper-Polyimide Wiring Technology for VLSI Circuits," Materials Research Society Symposium Proceedings VLSI V, 1990, pp. 369-373.

Ingerly D., et al., "Low-K Interconnect Stack with Thick Metal 9 Redistribution Layer and Cu Die Bump for 45nm High Volume Manufacturing," International Interconnect Technology Conference, 2008, pp. 216-218.

Jenei S., et al., "High Q Inductor Add-on Module in Thick Cu/SiLK Single Damascene," Proceedings from the IEEE International Interconnect Technology Conference, 2001, pp. 107-109.

John H.L., et al., "Chip Scale Package, General Electric's Chip-On-Flex Chip Scale Package (COFCSP)", Feb. 28, 1999, pp. 156-161, Chapter ten, McGraw-Hill Professional.

(56) References Cited

OTHER PUBLICATIONS

John H.L., et al., "Design Concepts and Package Structure, Chip Scale Package," Feb. 28, 1999, pp. 467-475, Chapter 10.2, McGrawHill Professional.
Kumar R., et al., "A Family of 45nm IA Processors," IEEE International Solid-State Circuits Conference, 2009, pp. 58-59, vol. 3 (2), Session 3, Microprocessor Technologies.
Kuo, "Semiconductor Packaging Engineering," Zhan Yi-Zheng Publisher, Registration Taipei, Apr. 2000, Table 9.1, with English translation thereof.
Kurd N., et al., "Next Generation Intel® Micro-architecture (Nehalem) Clocking Architecture," Symposium on VLSI Circuits Digest of Technical Papers, 2008, pp. 62-63.
Lau, J. et al. "Chip Scale Package—Design Materials Process Reliability and Applications", Chapt 10, pp. 157-161, McGraw-Hill professional, 1990.
Lee Y.H., et al., "Effect of ESD Layout on the Assembly Yield and Reliability," International Electron Devices Meeting, 2006, pp. 1-4.
Lin M.S., et al., "A New IC Interconnection Scheme and Design Architecture for High Performance ICs at Very Low Fabrication Cost—Post Passivation Interconnection," Proceedings of the IEEE Custom Integrated Circuits Conference, 2003, pp. 533-536.
Lin M.S., et al., "A New System-on-a-Chip (SOC) Technology High Q Post Passivation Inductors," Proceedings from the 53rd Electronic Components and Technology Conference (May 30, 2003), pp. 1503-1509.
Lin, M.S. "Post Passivation Technology—MEGIC Way to System Solutions", Presentation given at TSMC Technology Symposium, Japan (Oct. 1, 2003) pp. 1-32.
Luther B., et al., "Planar Copper-Polyimide Back End of the Line Interconnections for ULSI Devices," Proceedings of the 10th International IEEE VLSI Multilevel Interconnection Conference, 1993, pp. 15-21.
Maloney T., et al., "Novel Clamp Circuits for IC Power Supply Protection," IEEE Transactions on Components, Packaging, and Manufacturing Technology, Part C, 1996, pp. 150-161, vol. 19 (3).
Maloney T.J., et al., "Stacked PMOS Clamps for High Voltage Power Supply Protection," Electrical Overstress Electrostatic Discharge Symposium Proceedings, 1999, pp. 70-77.
Master R., et al., "Ceramic Mini-Ball Grid Array Package for High Speed Device," Proceedings from the 45th Electronic Components and Technology Conference, 1995, pp. 46-50.
Megic Corp., "Megic way to system solutions through bumping and redistribution", Brochure, Megic Corp, 2004, pp. 1-3.
Millman, Jacob; "Microelectronics Second Edition, McGraw Hill series in Electrical and Computer Engineering: Digital and Analog Circuits and Systems"; pp. 115 and 167 (1987).
Mistry K., et al., "A 45nm Logic Technology with High-k Metal Gate Transistors, Strained Silicon, 9 Cu Interconnect Layers, 193nm Dry Patterning, and 100% Pb-free Packaging," IEEE International Electron Devices Meeting, 2007, pp. 247-250.
Roesch W., et al., "Cycling Copper Flip Chip Interconnects," Microelectronics Reliability, 2004, pp. 1047-1054, vol. 44.
Sakran N., et al., "The Implementation of the 65nm Dual-Core 64b Merom Processor, Session 5, Microprocessors," IEEE International Solid-State Circuits Conference, 2007, pp. 106-107 and 590, vol. 5 (6).
Semiconductor packaging process, Chapter 9, Microstructures and properties of materials, p. 9-5 (1999).
Theng C., et al., "An Automated Tool Deployment for ESD (Electro-Static-Discharge) Correct-by-Construction Strategy in 90 nm Process," IEEE International Conference on Semiconductor Electronics, 2004, pp. 61-67.
Tummala R.R., et al., "An Overview & 8-2 Chip-Level Interconnection Evolution, Springer", Technology Drivers Part I, Jan. 31, 1997, pp. 12-13,64-65,82-87,133, Microelectronics Packaging Handbook ,Springer (Second Edition).
Tummala R.R., et al., "Microelectronic Packaging Handbook," 1989, pp. 673-725, Chapter 9, Van Nostrand Reinhold, NY.
Venkatesan S., et al., "A High Performance 1.8V, 0.20 pm CMOS Technology with Copper Metallization," Technical Digest IEEE International Electron Devices Meeting, 1997, pp. 769-772.
Yeoh A., et al., "Copper Die Bumps (First Level Interconnect) and Low-K Dielectrics in 65nm High Volume Manufacturing," Electronic Components and Technology Conference, 2006, pp. 1611-1615.
Yeoh T.S., "ESD Effects on Power Supply Clamps," Proceedings of the 6th International Symposium on Physical & Failure Analysis of Integrated Circuits, 1997, pp. 121-124.

\* cited by examiner

*Primary Examiner* — Matthew E Warren
(74) *Attorney, Agent, or Firm* — Seyfarth Shaw LLP

(57) ABSTRACT

An integrated chip package structure and method of manufacturing the same is by adhering dies on a ceramic substrate and forming a thin-film circuit layer on top of the dies and the ceramic substrate. Wherein the thin-film circuit layer has an external circuitry, which is electrically connected to the metal pads of the dies, that extends to a region outside the active surface of the dies for fanning out the metal pads of the dies. Furthermore, a plurality of active devices and an internal circuitry is located on the active surface of the dies. Signal for the active devices are transmitted through the internal circuitry to the external circuitry and from the external circuitry through the internal circuitry back to other active devices. Moreover, the chip package structure allows multiple dies with different functions to be packaged into an integrated package and electrically connecting the dies by the external circuitry.

36 Claims, 17 Drawing Sheets

INTEGRATED CHIP PACKAGE STRUCTURE USING CERAMIC SUBSTRATE AND METHOD OF MANUFACTURING THE SAME

CROSS-REFERENCE TO RELATED APPLICATION

This application is a divisional of U.S. patent application Ser. No. 10/454,972, filed on Jun. 4, 2003, now U.S. Pat. No. 8,535,976, which is a divisional of U.S. patent application Ser. No. 10/055,498, filed on Jan. 22, 2002, now U.S. Pat. No. 6,800,941, which claims the benefit of earlier filing date and right of priority benefit of Taiwan application serial no to Taiwanese Patent Application No. 90133092, filed on Dec. 31, 2001, the disclosures of which are expressly incorporated by reference herein in their entireties.

This application is related to U.S. patent application Ser. No. 10/054,001, filed on Jan. 19, 2002, now U.S. Pat. No. 6,673,698; and related to U.S. patent application Ser. No. 10/690,350, filed on Oct. 21, 2003, now abandoned; and related to U.S. patent application Ser. No. 10/996,535, filed on Nov. 24, 2004, now U.S. Pat. No. 7,397,117; and related to U.S. patent application Ser. No. 10/996,537, filed on Nov. 24, 2004, now U.S. Pat. No. 7,977,763; and related to U.S. patent application Ser. No. 10/055,560, filed on Jan. 22, 2002, now U.S. Pat. No. 8,119,446; and related to U.S. patent application Ser. No. 10/638,018, filed on Aug. 8, 2003, now U.S. Pat. No. 7,511,376; and related to U.S. patent application Ser. No. 10/977,289, filed on Oct. 28, 2004, now U.S. Pat. No. 7,271,033; and related to U.S. patent application Ser. No. 10/055,568, filed on Jan. 22, 2002, now pending; and related to U.S. patent application Ser. No. 10/174,462, filed on Jun. 17, 2002, now U.S. Pat. No. 6,746,898; and related to U.S. patent application Ser. No. 10/755,042, filed on Jan. 9, 2004, now pending; and related to U.S. patent application Ser. No. 10/055,499 filed on Jan. 22, 2002, now U.S. Pat. No. 7,413,929; and related to U.S. patent application Ser. No. 10/728,150 filed on Dec. 3, 2003, now U.S. Pat. No. 7,345,365; and related to U.S. patent application Ser. No. 10/794,472 filed on Mar. 5, 2004, now U.S. Pat. No. 7,297,614, all assigned to a common assignee.

BACKGROUND OF THE INVENTION

1. Field of the Invention

The present invention relates to an integrated chip package structure and method of manufacture the same. More particularly, the present invention relates to an integrated chip package structure and method of manufacture the same using ceramic substrate.

2. Description of Related Art

In the recent years, the development of advanced technology is on the cutting edge. As a result, high-technology electronics manufacturing industries launch more feature-packed and humanized electronic products. These new products that hit the showroom are lighter, thinner, and smaller in design. In the manufacturing of these electronic products, the key component has to be the integrated circuit (IC) chip inside any electronic product.

The operability, performance, and life of an IC chip are greatly affected by its circuit design, wafer manufacturing, and chip packaging. For this present invention, the focus will be on chip packaging technique. Since the features and speed of IC chips are increasing rapidly, the need for increasing the conductivity of the circuitry is necessary so that the signal delay and attenuation of the dies to the external circuitry are reduced. A chip package that allows good thermal dissipation and protection of the IC chips with a small overall dimension of the package is also necessary for higher performance chips. These are the goals to be achieved in chip packaging.

There are a vast variety of existing chip package techniques such as ball grid array (BGA), wire bonding, flip chip, etc. . . . for mounting a die on a substrate via the bonding points on both the die and the substrate. The inner traces helps to fan out the bonding points on the bottom of the substrate. The solder balls are separately planted on the bonding points for acting as an interface for the die to electrically connect to the external circuitry. Similarly, pin grid array (PGA) is very much like BGA, which replaces the balls with pins on the substrate and PGA also acts an interface for the die to electrically connect to the external circuitry.

Both BGA and PGA packages require wiring or flip chip for mounting the die on the substrate. The inner traces in the substrate fan out the bonding points on the substrate, and electrical connection to the external circuitry is carried out by the solder balls or pins on the bonding points. As a result, this method fails to reduce the distance of the signal transmission path but in fact increase the signal path distance. This will increase signal delay and attenuation and decrease the performance of the chip.

Wafer level chip scale package (WLCSP) has an advantage of being able to print the redistribution circuit directly on the die by using the peripheral area of the die as the bonding points. It is achieved by redistributing an area array on the surface of the die, which can fully utilize the entire area of the die. The bonding points are located on the redistribution circuit by forming flip chip bumps so the bottom side of the die connects directly to the printed circuit board (PCB) with micro-spaced bonding points.

Although WLCSP can greatly reduce the signal path distance, it is still very difficult to accommodate all the bonding points on the die surface as the integration of die and internal devices gets higher. The pin count on the die increases as integration gets higher so the redistribution of pins in an area array is difficult to achieve. Even if the redistribution of pins is successful, the distance between pins will be too small to meet the pitch of a printed circuit board (PCB).

SUMMARY OF THE INVENTION

Therefore the present invention provides an integrated chip package structure and method of manufacturing the same that uses the original bonding points of the die and connect them to an external circuitry of a thin-film circuit layer to achieve redistribution. The spacing between the redistributed bonding points matches the pitch of a PCB.

In order to achieve the above object, the present invention presents an integrated chip package structure and method of manufacturing the same by adhering the backside of a die to a ceramic substrate, wherein the active surface of the die has a plurality of metal pads. A thin-film circuit layer is formed on top of the die and the ceramic substrate, where the thin-film circuit layer has an external circuitry that is electrically connected to the metal pads of the die. The external circuitry extends to a region that is outside the active area of the dies and has a plurality of bonding pads located on the surface layer of the thin-film layer circuit. The active surface of the die has an internal circuitry and a plurality of active devices, where signals can be transmitted from one active device to the external circuitry via the internal circuitry, then from the external circuitry back to another active device via the internal circuitry. Furthermore, the ceramic substrate has at least one inwardly protruded area so the backside of the die can be adhered inside the inwardly protruded area and exposing the active surface of the die. Wherein the ceramic substrate is composed of a ceramic layer and a heat conducting material formed overlapping and the inwardly protruded areas are formed by overlapping the ceramic substrate with openings on the heat conducting layer. Furthermore, the present chip package structure allows multiple dies with same or different functions to he packaged into one integrated chip package and permits electrically connection between the dies by the external circuitry.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1A:
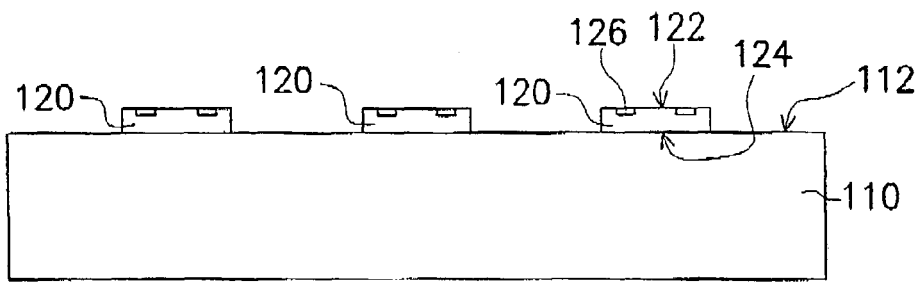
FIG. 1A to 1I are schematic diagrams showing the sectional view of the structure of the first embodiment of the present invention.

Please refer to FIG. 1A, a ceramic substrate 110 with a surface 112 usually of aluminum oxide material or other ceramic material is provided. A plurality of dies 120 having an active surface 122 and a backside 124 is also provided, where the active devices are formed on active surface 122 of the dies. Furthermore, dies 120 have a plurality of metal pads 126 located on active surface 122 of dies 120 acting as the output terminal of dies 120 to transmit signals to the external circuitry. Backside 124 of dies 120 is adhered to surface 112 of ceramic substrate 110 by a conductive paste or adhesive tape. Therefore, active surface 122 of dies 120 is facing upwards along surface 112 of ceramic substrate 110.

Figure 1B:
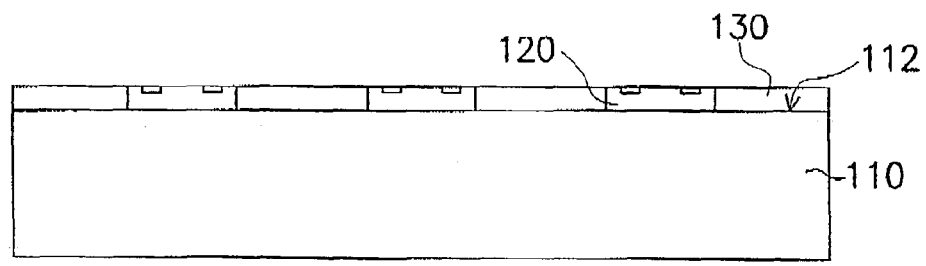

Please refer to FIG. 1B, when adhering die 120 to ceramic substrate 110, a filling layer 130 can be formed on top of surface 112 of ceramic substrate 100 surrounding the peripheral of dies 120 to fill the gap between dies 120. The height of filling layer 130 should be approximately equal to the height of active surface 122 of dies 120. The material of filling layer 130 can be epoxy, polymer, or the like. After curing of filling layer 130, a grinding or etching process is applied to planarize filling layer 130 so the top face of filling layer 130 is planar with active surface 122 of dies 120.

Figure 1C:
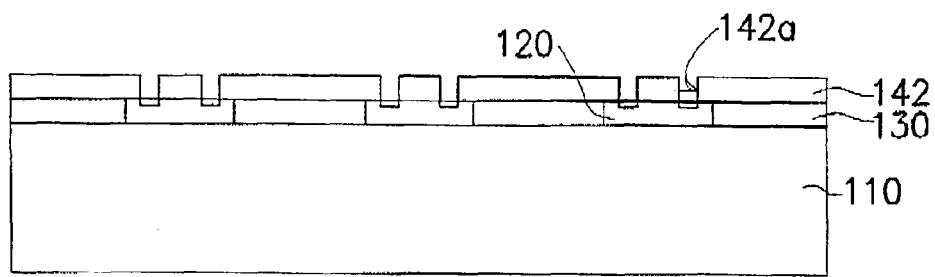

Please refer to FIG. 1C, after the formation of filling layer 130 on ceramic substrate 110, a dielectric layer 142 is formed on top of filling layer 130 and active surface 122 of dies 120. Dielectric layer 142 is patterned according to metal pads 126 on dies 120 to form thru-holes 142a. The material of dielectric layer 142 can be poly-Imide (PI), benzocyclobutene (BCB), porous dielectric material, stress buffer material, or the like. Patternization of dielectric layer 142 can be performed by photo via, laser ablation, plasma etching, or the like.

Please continue to refer to FIG. 1C, filling layer 130 is used to support dielectric layer 142 so dielectric layer 142 can be formed planarized on top of ceramic substrate 110 and dies 120 without an uneven surface. As a result, after dielectric layer 142 is formed on surface 112 of ceramic substrate 110 and active surface 122 of die 120, dielectric layer 142 also fills the peripheral of dies 120, meaning the gap between dies 120. Therefore the bottom structure of dielectric layer 142 can replace the structure of filling layer 130 covering entirely surface 112 of ceramic substrate 110 and surrounding dies 120. The method of forming dielectric layer 142 includes first depositing a layer of dielectric layer 142 entirely over dies 120 and ceramic substrate 110, then after curing, a grinding or etching process is performed to planarize dielectric layer 142.

Figure 1D:
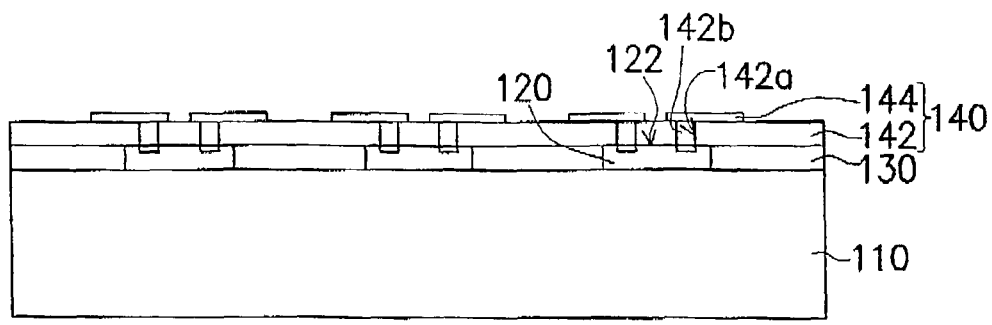

Please refer to FIG. 1D, after forming dielectric layer 142 and patterning dielectric layer 142 to form thru-holes 142a, a patterned wiring layer 144 is formed on top of dielectric layer 142 by photolithography and sputtering, electroplating, or electro-less plating. Wherein part of the conductive material from patterned wiring layer 144 will be injected into thru-holes 142a to form vias 142b, copper (Cu) is used as the material for patterned wiring layer 144. Moreover, thru-holes 142a can be pre-filled with a conductive material such as a conductive glue to form vias 142b. Therefore no matter if the thru-holes are filled with the conductive material from patterned wiring layer 144 or pre-filled with a conductive material, patterned wiring layer 144 is electrically connected to metal pads 126 of dies 120. It is to be noted that part of patterned wiring layer 144 extends to a region outside active surface 122 of dies 120. Dielectric layer 142 and patterned wiring layer 144 form a thin-film circuit layer 140.

Figure 1E:
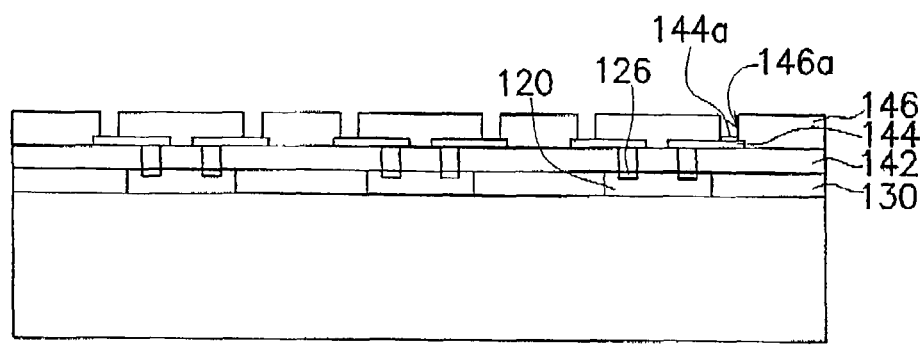

Please refer to FIG. 1E, after the formation of patterned wiring layer 144, another dielectric layer 146 can be formed similarly to dielectric layer 142 on top of dielectric layer 142 and patterned wiring layer 144. Dielectric layer 146 is also patterned to form thru-holes 146a, whereas thru-holes 146a correspond to bonding pads 144a of patterned wiring layer 144.

Figure 1F:
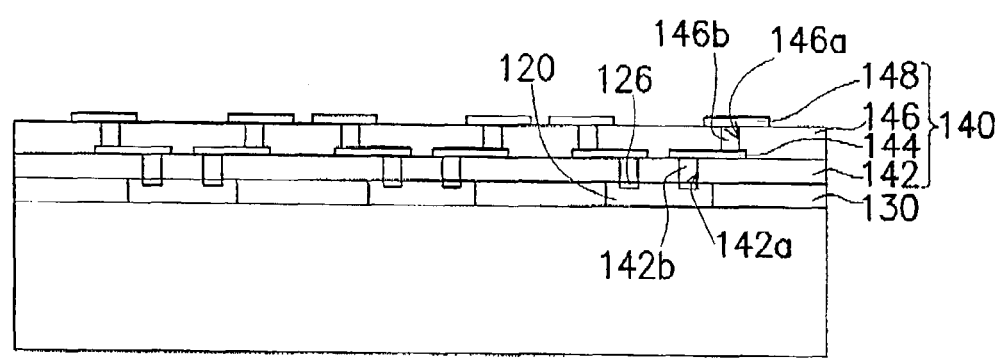

Please refer to FIG. 1F, after the formation and patternization of dielectric layer 146 to form thru-holes 146a, a patterned wiring layer 148 can be formed on dielectric layer 146 in a similar way as patterned wiring layer 144. Wherein part of the conductive material from patterned wiring layer 148 will be injected into thru-hole 146a forming a via 146b. By the same token, patterned wiring layer 148 is electrically connected to patterned wiring layer 144 by vias 146b, and further electrically connected to metal pads 126 of die 120 by vias 142b of thru-hole 142a. Therefore, thin-film circuit layer 140 further comprises dielectric layer 146, a plurality of vias 146b, and patterned wiring layer 148.

Please continue to refer to FIG. 1F, in order to redistribute all metal pads 126 of dies 120 on ceramic substrate 110, the number of patterned wiring layers (144, 148 . . . ) and dielectric layers (142, 146 . . . ) for electrical insulation may be increased. All patterned wiring layers (144, 148 . . . ) are electrically connected by vias (146b . . . ) of thru-holes (146a . . . ). However if only the first patterned wiring layer 144 is required to entirely redistribute metal pads 126 of dies 120 on ceramic substrate 110, extra dielectric layers (146 . . . ) and patterned wiring layers (148 . . . ) will no longer be required in the structure. In other words, thin-film circuit layer 140 comprises at least one dielectric layer 142, one patterned wiring layer 144, and a plurality of vias 142b. Wherein patterned wiring layer (144, 148 . . . ) and vias (142b, 146b . . . ) of thin-film circuit layer 140 form an external circuitry of thin-film circuit layer 140.

Figure 1G:
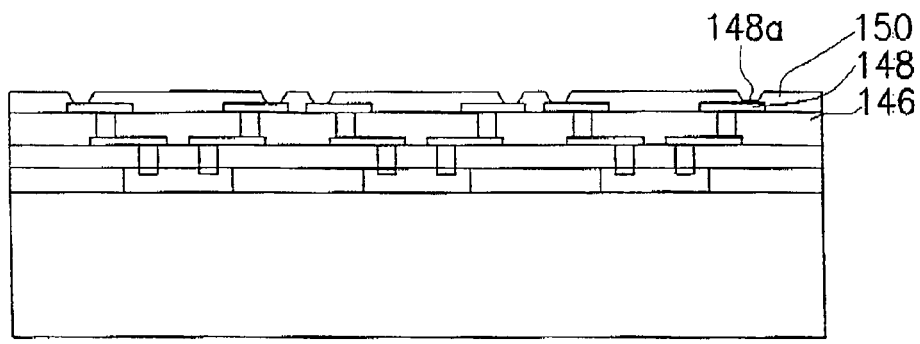

Please refer to FIG. 1G, after the formation of patterned wiring layer 148, a patterned passivation layer 150 is formed on top of dielectric layer 146 and patterned wiring layer 148. Patterned passivation layer 150 is used to protect patterned wiring layer 148 and expose the plurality of bonding pads 148a of patterned wiring layer 148, whereas some of bonding pads 148a are in a region outside active surface 122 of dies 120. As previously mentioned, the redistribution of metal pads 126 on ceramic substrate 110 requires multiple layers of patterned wiring layers (144, 148 . . . ) and a patterned passivation layer 150 formed on the very top, which is furthest away from ceramic substrate 110. However, if only patterned wiring layer 144 is required to redistribute metal pads 126 of dies 120 on ceramic substrate 110, patterned passivation layer 150 will be formed directly on patterned wiring layer 144. The material of passivation layer 150 can be anti-solder insulating coating or other insulating material.

Figure 1H:
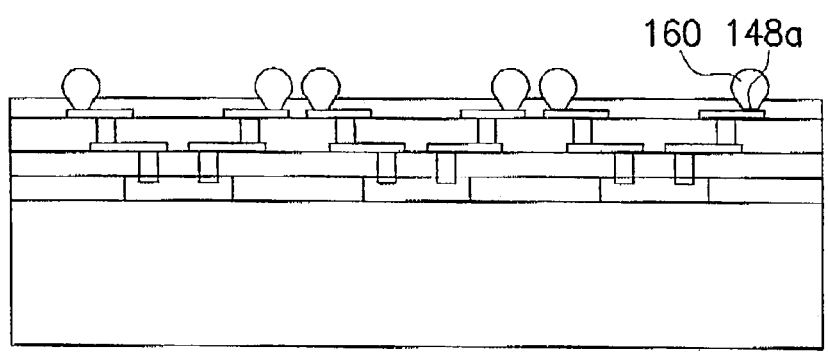

Please refer to FIG. 1H, after the formation of patterned passivation layer 150, a bonding point 160 can be placed on bonding pads 148a serving as an interface for electrically connecting die 120 to the external circuitry. Wherein bonding point 160 illustrated in FIG. 1H is a ball but it is not limited to any formation, which might include a bump, pin, or the like. Ball connector maybe solder ball, and bump connector maybe solder bump, gold bump, or the like.

Figure 1I:
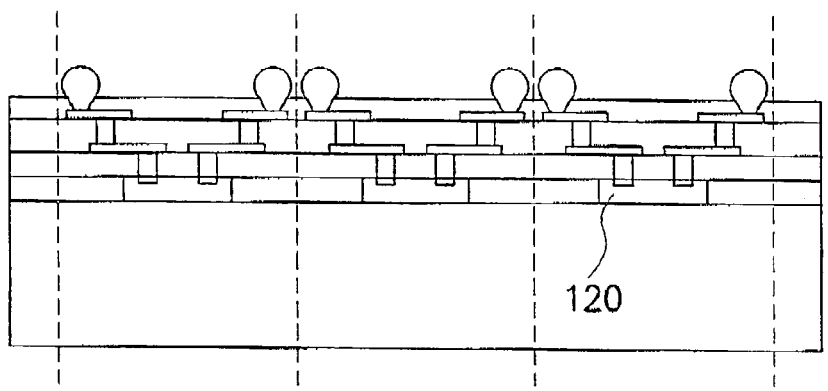

Please refer to FIG. 1I, after the formation of bonding points 160 on bonding pads 148a, a singularization process of packaged die 120 by mechanical or laser cutting is performed along the dotted line as indicated in the diagram. Afterwards, the chip package structure of the die is completed.

According to the above, the first embodiment of the present invention is a chip package structure with a ceramic substrate and a plurality of dies on it. The external circuitry of the thin-film circuit layer allows the metal pads of the die to fan out. By forming bonding pads corresponding to the metal pads of the dies such as solders balls, bumps, or pins as the signal input terminals, the distance of the signal path is effectively decreased. As a result, signal delay and attenuation are reduced to increase performance of the die.

Ceramic material possesses advantageous properties such as high structural rigidity, high anti-corrosive properties, high density, and high thermal conductivity. Coefficient of thermal expansion (CTE) of aluminum oxide ceramic material is comparable to that of iron-cobalt-nickel alloy. The present invention specifically applies the use of ceramic material due to its high structural rigidity, high anti-corrosive properties, high density, and high thermal conductivity, which means that the package structure can be used in unfavorable environments such as high-corrosiveness, high humidity, or high temperature environment. The high CTE of ceramic material will help the dies to dissipate heat for improved performance. Furthermore, the fabrication of ceramic-BGA (CBGA) substrate is already well know in the art, therefore current manufacturing machines can be easily adapted to manufacture the ceramic substrate of the present invention for lower cost.

Figure 2A:
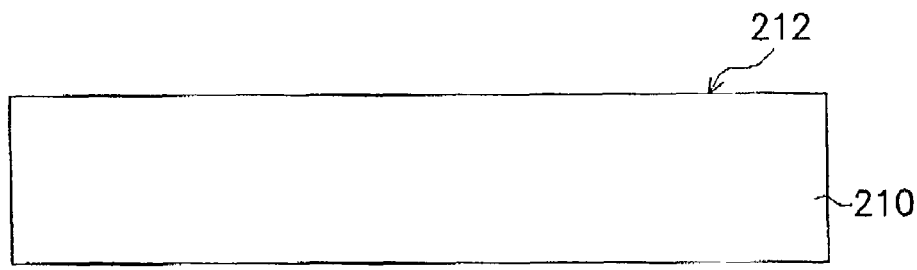
FIG. 2A to 2C are schematic diagrams showing the sectional view of the structure of the second embodiment of the present invention.
Figure 2B:
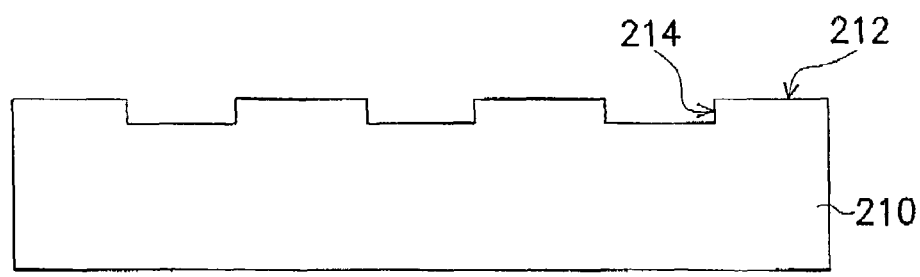
Figure 2C:
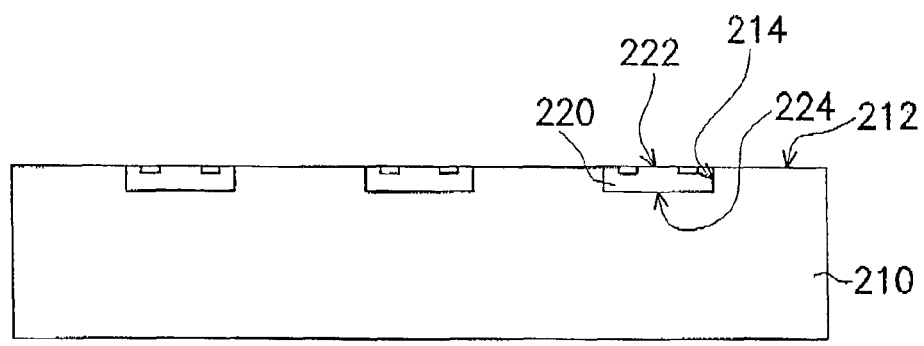

The second embodiment of the present invention differs from the first embodiment by having inwardly protruded areas in the ceramic substrate. This area is for placement of the die with the backside of the die adhered to the bottom of the area so the overall thickness of the chip package structure is reduced. FIG. 2A to 2C are schematic diagrams of the sectional view of the second embodiment illustrating the fabrication of the structure.

Please refer to FIG. 2A, a ceramic substrate 210 with a surface 212 is provided. In FIG. 2B, a plurality of inwardly protruded areas 214 is formed on ceramic substrate 210 by machining such as milling. The depth of each inwardly protruded area 214 is approximately equal to the thickness of die 220, therefore the outline and depth of inwardly protruded areas 214 will be the same as dies 220 in FIG. 2C. In FIG. 2C, backside 224 of dies 220 is adhered to the bottom of inwardly protruded areas 214 so dies 220 are inlayed in inwardly protruded areas 214. Active surface 222 of die 220 is exposed along surface 212 or ceramic substrate 210.

Figure 2D:
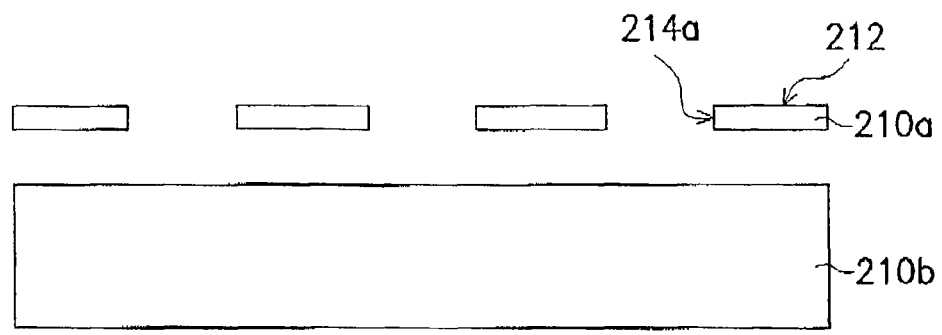
FIG. 2D to 2E are schematic diagrams showing the section view of the formation of inwardly protruded areas in the organic substrate of the structure of the second embodiment of the present invention.

An alternative method of forming inwardly protruded areas 214 in ceramic substrate 210 in FIG. 2B is to use two green sheets 210a and 210b that are not sintered, as illustrated in FIG. 2D. Green sheet 210a has openings 214a and by overlapping the two green sheets 210a, 210b and sintering them at a high temperature, opening 214a in green sheet 210a will form inwardly protruded areas 214 on green sheet 210b as seen before in FIG. 2B, illustrated in FIG. 2E. The thickness of green sheet 210a is approximately equal to that of die 220 so the depth of inwardly protruded areas 214 is approximately equal to the thickness of die 220.

Figure 2E:
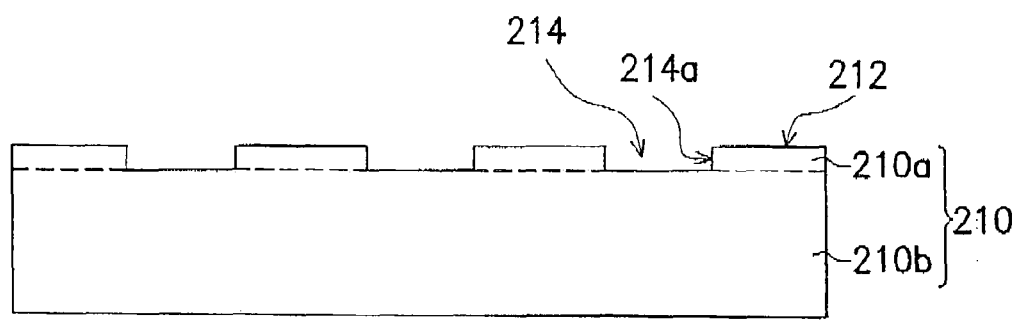

Furthermore, in FIGS. 2D and 2E, the two green sheets 210a and 210b provided can be already sintered before putting together. Openings 214a can be formed before or after sintering green sheet 210a. Following, the two green sheet 210a, 210b are overlapped to form inwardly protruded openings 214 in ceramic substrate 210.

The structure of the second embodiment of the present invention after FIG. 2C will follow FIG. 1C to 1I from the first embodiment of the present invention, therefore it will not be repeated.

The second embodiment of the present invention is a ceramic substrate with a plurality of inwardly protruded areas for inlaying dies by adhering the backside of the dies to the bottom of the inwardly protruded areas and exposing the active surface of the dies. A thin-film circuit layer is formed on top of the dies and the ceramic substrate to fan out the metal pads of the dies by using the external circuitry of the thin-film circuit layer. Due to the inlay of the dies in the ceramic substrate, thinning of the thickness of the chip package structure is effectively achieved and the surface of the ceramic substrate provides enough planarity and support for the formation of the thin-film circuit layer.

Figure 3A:
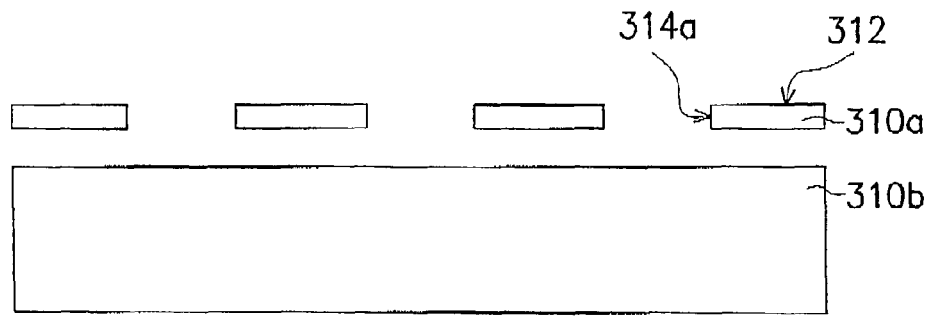
FIG. 3A to 3C are schematic diagrams showing the sectional view of the structure of the third embodiment of the present invention.
Figure 3B:
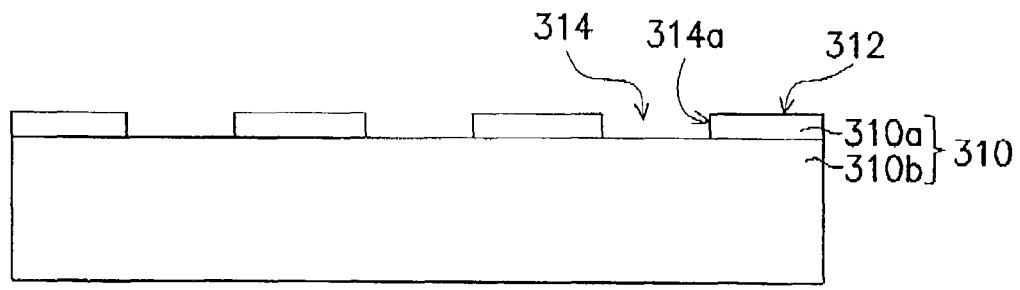
Figure 3C:
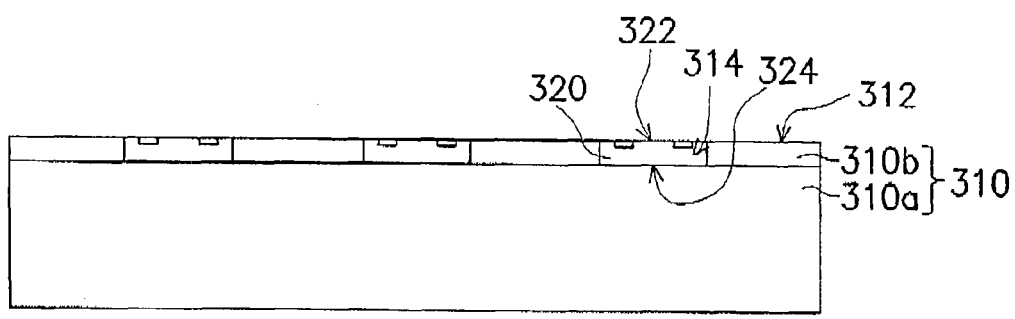

The third embodiment of the present invention differs from the second embodiment of the present invention by using an integrated ceramic substrate with at least one ceramic layer and one heat conducting layer. FIG. 3A to 3C are schematic diagrams of the sectional view of the third embodiment illustrating the fabrication of the structure.

Please refer to FIG. 3A, an integrated ceramic substrate 310 consists of a ceramic layer 310a with multiple openings 314a and a heat conducting layer 310b, wherein the material of heat conducting layer 310b maybe metal. In FIG. 3B, ceramic layer 310a is placed overlapping heat conducting layer 310b so openings 314a of ceramic layer 310a form inwardly protruded areas 314. Following in FIG. 3C, backside 324 of die 320 is adhered to the bottom of inwardly protruded areas 314 so dies 320 are inlayed in ceramic substrate 310 with active surface 322 of die 320 exposed along surface 312 of ceramic board 310.

The following presents two ways of forming integrated ceramic substrate 310 with inwardly protruded areas 314 as shown in FIG. 3B. In FIG. 3A, a non-sintered ceramic layer (green sheet) 310a with openings 314a is provided, and in FIG. 3B, the non-sintered ceramic layer 310a is overlapped on heat conductive layer 310b so openings 314a of ceramic layer 310a can form inwardly protruded areas 314 on the surface of heat conducting layer 310b. Afterwards, integrated ceramic substrate 310 with ceramic layer 310a and heat conducting layer 310b are sintered at a temperature above 1000° C. Therefore the material of heat conducting layer 310b must have a higher melting temperature than the temperature used for sintering the green sheet.

The alternative method is using an already-sintered ceramic layer 310a with openings 314a. The already-sintered ceramic substrate layer 310a is overlapped on heat conducting layer 310b so openings 314a of ceramic layer 310a can form inwardly protruded areas 314. The thickness of ceramic layer 310a is approximately equal to that of die 320 so the depth of openings 314a is also approximately equal to the thickness of die 320.

The structure of the third embodiment of the present invention after FIG. 3C will follow FIG. 1C to 1I from the first embodiment of the present invention, therefore it will not be repeated.

The third embodiment of the present invention is an integrated ceramic substrate with a ceramic layer with a plurality of openings and a heat conducting layer. The openings in the ceramic layer will form inwardly protruded areas on the integrated ceramic substrate. Backside of the die adheres to the bottom of the inwardly protruded areas so the dies are inlayed in the inwardly protruded areas exposing the active surface of the dies. This integrated ceramic substrate can efficiently dissipate heat from the dies to the outside because the bottom of the inwardly protruded area is the surface of the heat conducting material. The surface of the ceramic substrate provides enough planarity and support for the formation of the thin-film circuit layer.

The fourth embodiment of the present invention is slightly different from the first three embodiments. FIG. 4A to 4E are schematic diagrams of the sectional view of the fourth embodiment illustrating the fabrication of the structure.

Figure 4A:
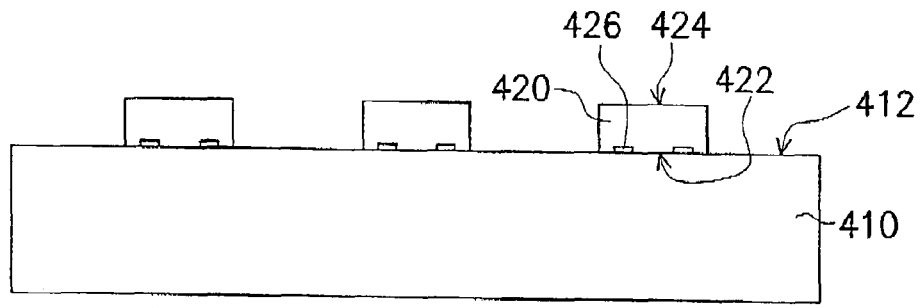
FIG. 4A to 4I are schematic diagrams showing the sectional view of the structure of the forth embodiment of the present invention.

Please refer to FIG. 4A, a ceramic substrate 410 with a first surface 412 and a plurality of dies 420 are provided. The dies 420 have an active surface 422, a backside 424, and a plurality of metal pads 426 located on active surface 422. The fourth embodiment of the present invention differs from the third embodiment of the present invention by placing active surface 422 of die 420 downwards facing first surface 412 of ceramic substrate 410.

Figure 4B:
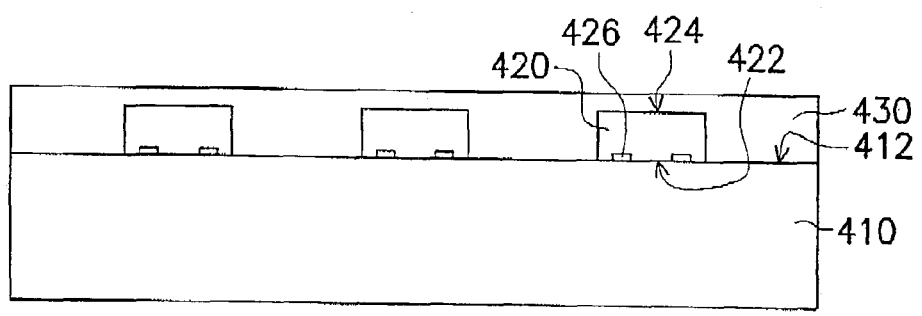

Please refer to FIG. 4B, a filling layer 430 is formed on top of first surface 412 of ceramic substrate 410 after active surface 422 of die 420 is adhered to first surface 412 of ceramic substrate 410. Filling layer 430 covers entirely first surface 412 of ceramic substrate 410 and surrounds dies 420. The material of filling layer 430 maybe an oxide, epoxy, or the like.

Figure 4C:
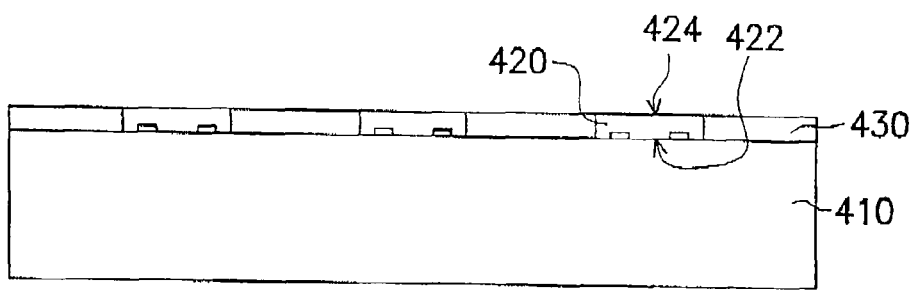

Please refer to FIG. 4C, after the formation of filling layer 430, a planarization process such as grinding is performed to planarize filling layer 430 and backside 424 of dies 420. Although the thickness of the active devices and wiring (not shown) on active surface 422 of die 420 is much less than that of dies 420, the thickness of die 420 should not be too small because cracks or damage to the die will occur during machine handling. However the present invention directly adheres active surface 422 of dies 420 to first surface 412 of ceramic substrate 410 without further machine handling. Afterwards a grinding process is performed on backside 424 of dies 420 to reduce the thickness of dies 420. As a result, dies 420 are ground to a very small thickness allowing the final chip package structure to be much thinner.

Figure 4D:
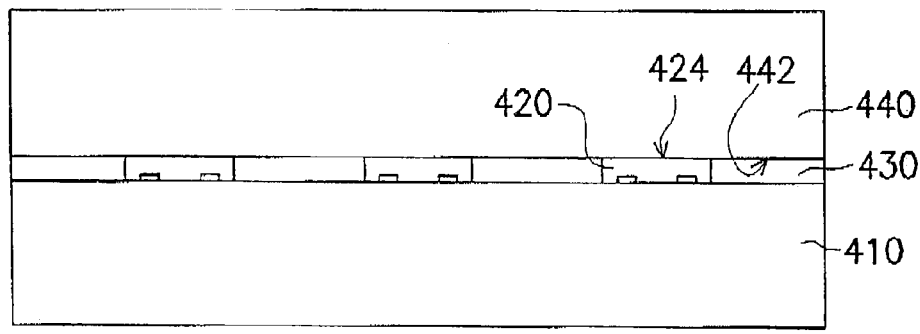

Please refer to FIG. 4D, after the planarization of filling layer 430 and dies 420, a second ceramic substrate 440 with a second surface 442 is adhered to filling layer 430 and dies 420 creating a sandwich effect with filling layer 430 and dies 420 in between two ceramic substrates 410 and 440.

Figure 4E:
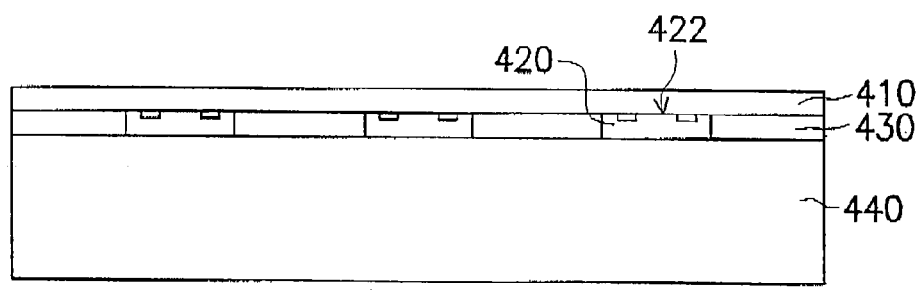

Please refer to FIG. 4E, after the adhesion of second ceramic substrate 440, a grinding or the like process is performed to thin the backside of ceramic substrate 410 to achieve a thickness of about 2 microns to 200 microns, usually about 20 microns. First ceramic substrate 410 is used to provide a planar surface for dies 420 to adhere to and to serve as an insulating layer. Therefore ceramic substrate 410 can be replaced by substrate made of glass or other organic material.

Figure 4F:
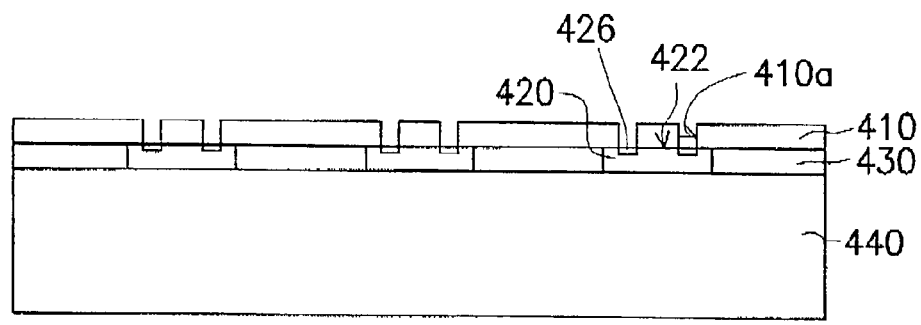

Please refer to FIG. 4F, after the thinning of first ceramic substrate 410, a plurality of first thru-holes 410a are formed on first ceramic substrate 410 for exposing metal pads 426 of active surface 422 of die 420. First thru-holes 410a can be formed by machine drilling, laser, plasma etching, or similar methods.

Figure 4G:
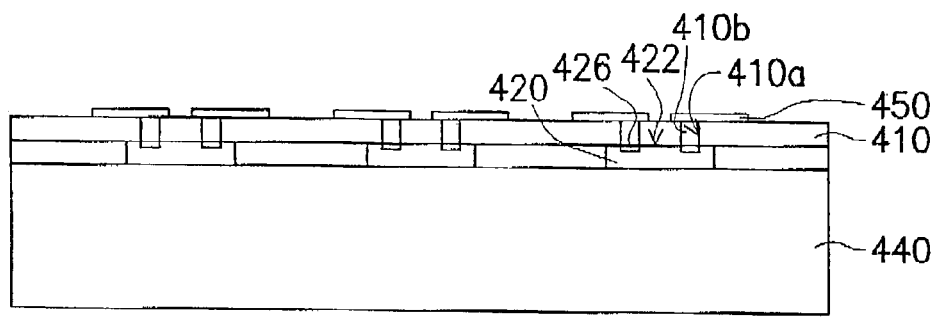

Please refer to FIG. 4G, a first patterned wiring layer 450 is formed on first ceramic substrate 410. Using the same method disclosed in the first embodiment of the present invention, first vias 410b in first thru-holes 410a are formed by either filling first thru-holes 410a with part of the conductive material from patterned wiring layer 450 or pre-filling first thru-holes 410a with a conductive material before the formation of patterned wiring layer 450. A part of patterned wiring layer 450 will extend to a region outside active surface 422 of die 420.

Figure 4H:
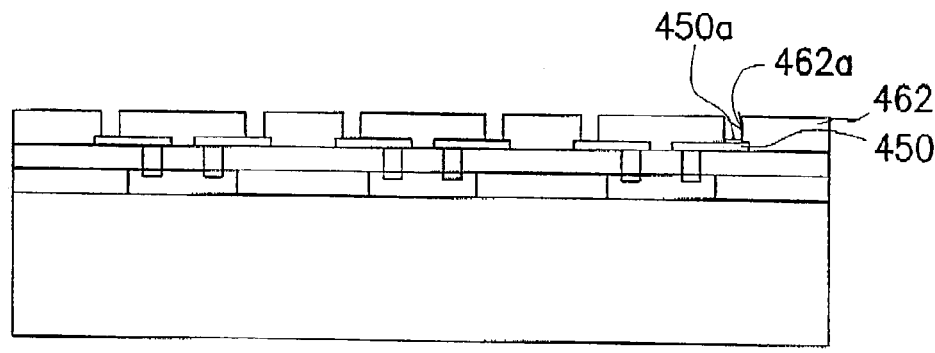

Please refer to FIG. 4H, a dielectric layer 462 is formed on first ceramic substrate 410 and first patterned wiring layer 450. Wherein dielectric layer 462 is patterned to form a plurality of second thru-holes 462a, which correspond to bonding pad 450a of patterned wiring layer 450.

Figure 4I:
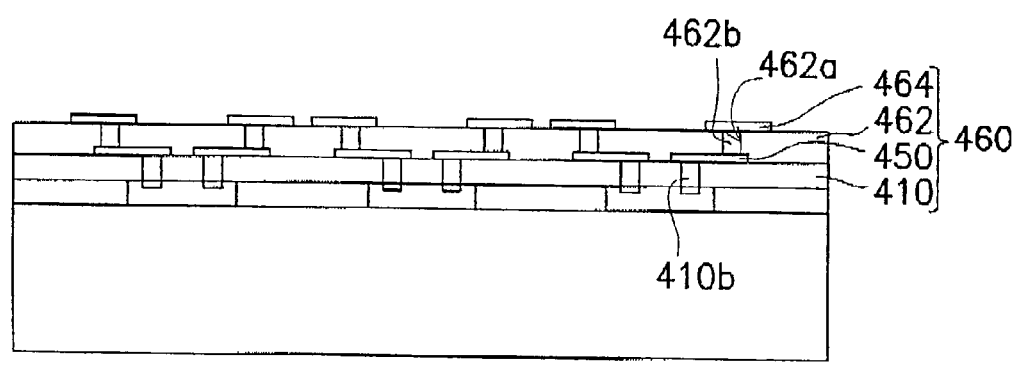

Please refer to FIG. 4I, a second patterned wiring layer 464 is formed on dielectric layer 462. Using the same method as above, second vias 462b in second thru-holes 462a can be formed by either filling second thru-holes 462a with part of the conductive material from patterned wiring layer or pre-fill second thru-holes 462a with a conductive material before the formation of patterned wiring layer 464. Similarly, in order to redistribute metal pads 426 of dies 420 on second ceramic substrate 440, dielectric layer (462 . . . ), second vias (462a . . . ), and second patterned wiring layer (464 . . . ) can be repeatedly formed on dies 420 and second ceramic substrate 440. Wherein first ceramic substrate 410, first patterned wiring layer 450, dielectric layer 462 . . . , and second patterned wiring layer 464 . . . form thin-film circuit layer 460. First vias 410b, first patterned wiring layer 450, second vias 462b and second patterned wiring layer 464 form the external circuitry of thin-film circuit layer 460.

The structure of the fourth embodiment of the present invention after FIG. 4I will follow FIG. 1G to 1I from the first embodiment of the present invention, therefore it will not be repeated.

The fourth embodiment of the present invention is a ceramic substrate with the active surface of the dies directly adhered to the surface of the first ceramic substrate. A filling layer is formed over the dies and the ceramic substrate followed by a planarization and thinning process. Afterwards, a second ceramic substrate is adhered to the die and the filling layer. A thinning process of the first ceramic substrate is performed and a plurality of thru-holes filled with conductive material are formed on the first ceramic substrate. Finally a patterned wiring layer is formed on the first ceramic substrate allowing the external circuitry of the thin-film circuit layer to extend to a region outside the active surface of the die to help fan out the metal pads of the die.

The advantage of this structure is increased surface stability and accuracy because the active surface of the dies are first adhered to the surface of the first ceramic substrate. The thickness of the die can be very small for reducing the overall thickness of the chip package because no machine handling of dies is required.

The fifth embodiment of the present invention takes the first half of the fabrication process from the fourth embodiment of the present invention and combines with the second half of the fabrication process from the first embodiment of the present invention. FIG. 5A to 5E are schematic diagrams of the sectional view illustrating the fabrication of the structure.

Figure 5A:
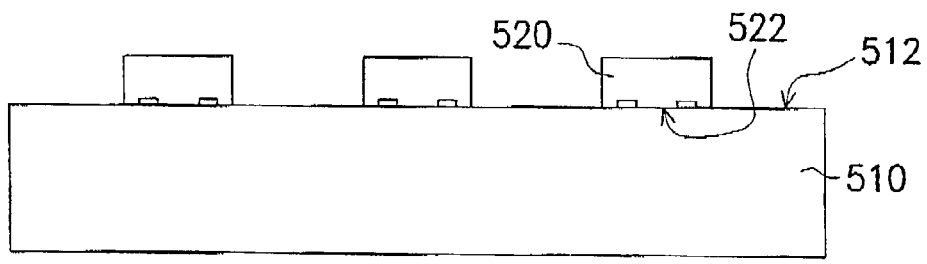
FIG. 5A to 5E are schematic diagrams showing the sectional view of the structure of the fifth embodiment of the present invention.
Figure 5B:
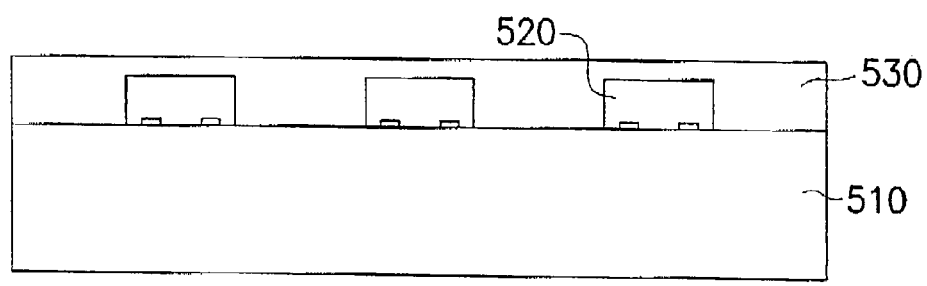
Figure 5C:
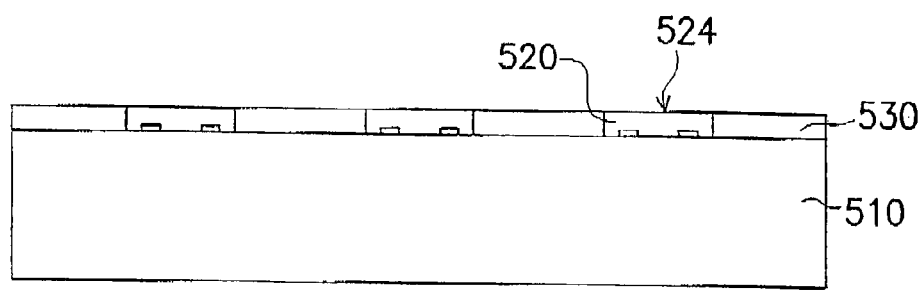
Figure 5D:
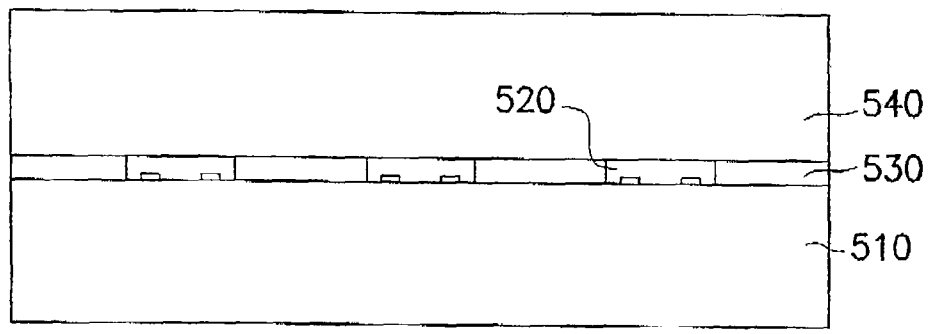

Please refer to FIG. 5A, an active surface 522 of dies 520 is adhered to a first surface 512 of a first ceramic substrate 510. In FIG. 5B, a filling layer 530 is formed on top of dies 520 and first ceramic substrate 510 covering dies 520. In FIG. 5C, a planarization and thinning process of dies 520 and filling layer 530 is performed to planarize backside 524 of dies 520 and filling layer 530. In FIG. 5D, a second ceramic substrate 540 is formed on top of dies 520 and filling layer 530 so backside 524 of dies 520 adheres to second ceramic substrate 540. By removing filling layer 530 and first ceramic substrate 510, the metal pads on active surface 522 of dies 520 are exposed. First ceramic substrate 510 is used to supply a planarized surface (first surface 512), and will be removed in later stages of the fabrication process. Therefore first ceramic substrate 510 can be replaced by substrates of other materials such as glass, metal, silicon, or other organic material.

Figure 5E:
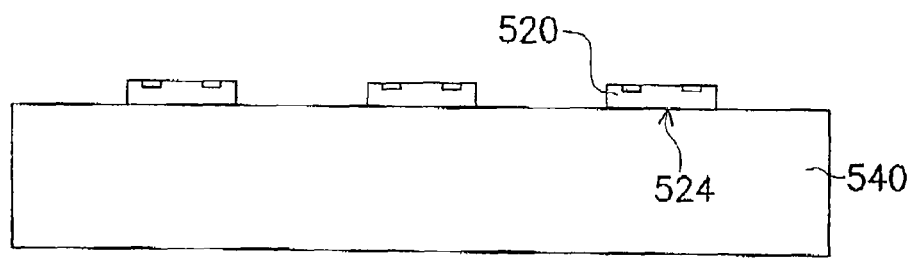

The structure of the fifth embodiment of the present invention after FIG. 5E will follow FIG. 1B to 1I of the first embodiment of the present invention, therefore it will not be repeated.

The fifth embodiment of the present invention is a ceramic substrate with the active surface of the die adhered to the surface of the first ceramic substrate for allowing high surface stability and accuracy. As a result, it eliminates the need of machine handling of the dies to achieve a very small thickness of the die for reducing the overall thickness of the chip package.

Figure 6:
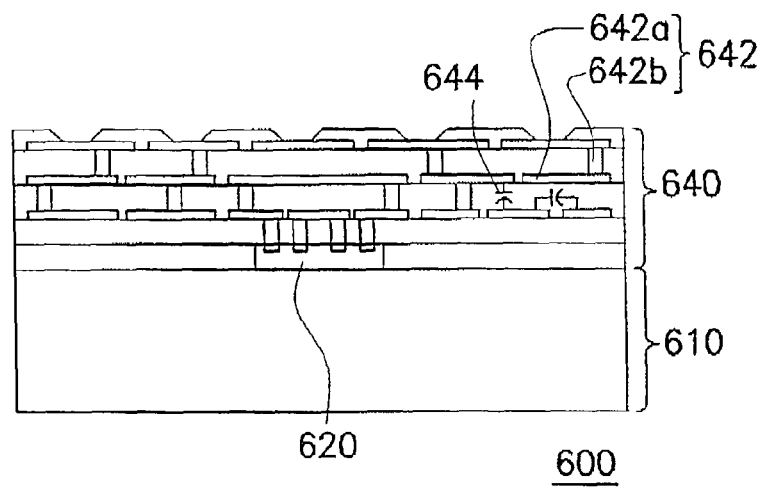
FIG. 6 is a schematic diagram showing the section view of the chip package structure of a preferred embodiment of the present invention with one die.

Furthermore, please refer to FIG. 6, it illustrates the schematic diagram of the sectional view of the chip package structure 600 of the present invention for a single die 620. Die 620 is placed on ceramic substrate 610, and a thin-film circuit layer 640 is formed on top of dies 620 and ceramic substrate 610. External circuitry 642 of thin-film circuit layer 640 has at least has one patterned wiring layer 642a and a plurality of vias 642b. The thickness of the inner traces inside die 620 is usually under 1 micron, but because the high amount of traces collocated together so RC delay is relatively high and the power/ground bus requires a large area. As a result, the area of die 620 is not enough to accommodate the power/ground bus. Therefore the chip package structure 600 uses thin-film circuit layer 640 and external circuitry 642 with wider, thicker, and longer traces to alleviate the problem. These traces act an interface for transmitting signals for the internal circuitry of die 620 or the power/ground bus of die 620. This will improve the performance of die 620.

Figure 8:
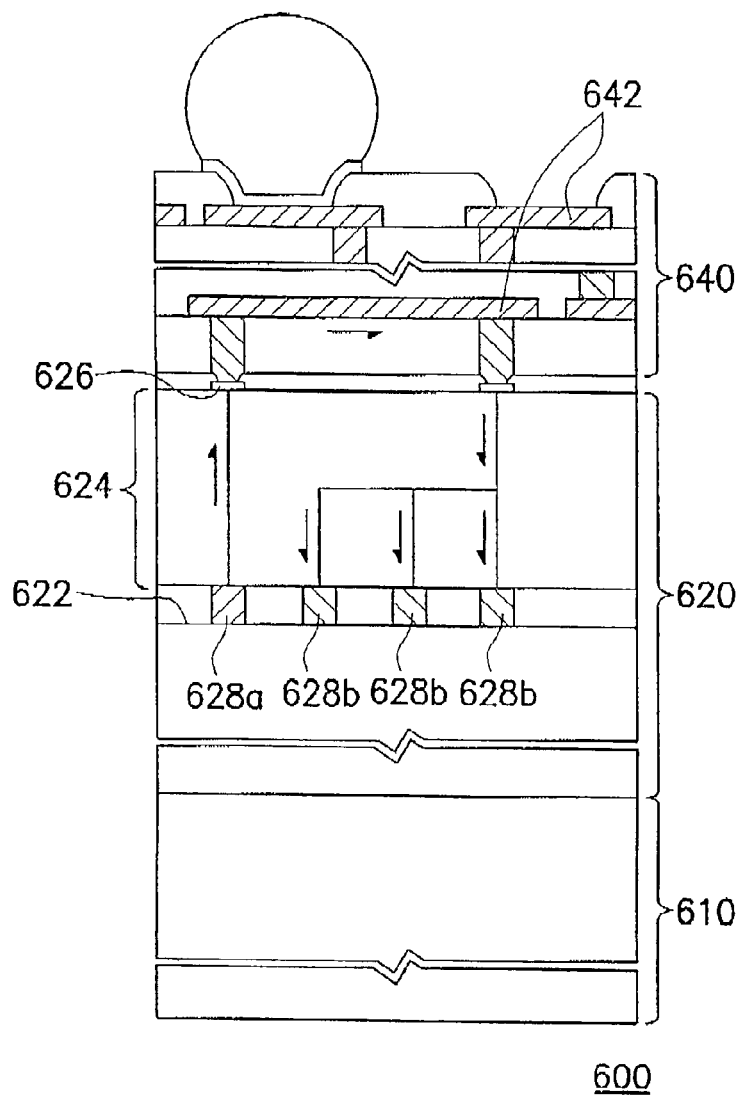
FIG. 8 is a magnified diagram showing the sectional view of the chip package structure of a preferred embodiment of the present invention.

Please refer to FIG. 8, it illustrates a magnified view of the sectional view of the chip package structure of the present invention. Active surface 622 of die 620 has a plurality of active devices 628a, 628b, and an internal circuitry 624. The internal circuitry 624 forms a plurality of metal pads 626 on the surface of die 620. Therefore signals are transmitted from active devices 628a to external circuitry 642 via internal circuitry 624 of die 620, and from external circuitry 642 back to another active device 628b via internal circuitry 624. The traces of external circuitry 642 are wider, longer, and thicker than that of internal circuitry 624 for providing an improved transmission path.

Figure 9A:
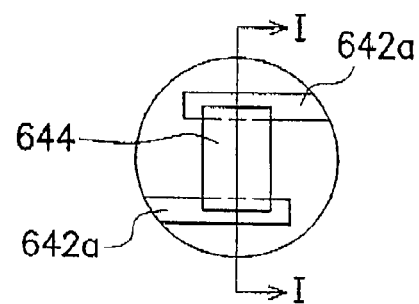
FIGS. 9A, 9B are schematic diagrams of the top and side view respectively of the patterned wiring layer of the thin-film circuit layer with a passive device.
Figure 9B:
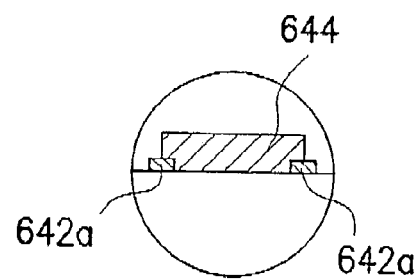
Figure 10A:
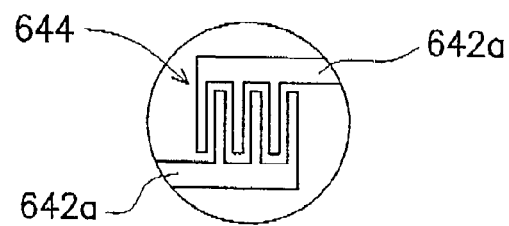
FIG. 10A is a schematic diagram of the formation of a passive device by a single layer of patterned wiring layer of the thin-film circuit layer.
Figure 10B:
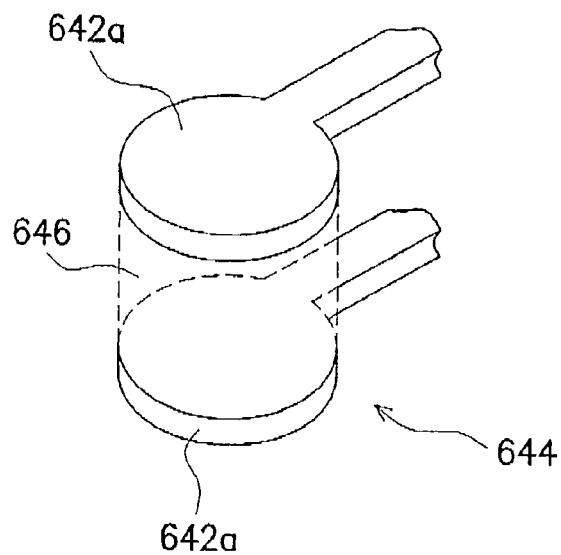
FIG. 10B is a schematic diagram of the formation of a passive device by a double layer of patterned wiring layer of the thin-film circuit layer.
Figure 11A:
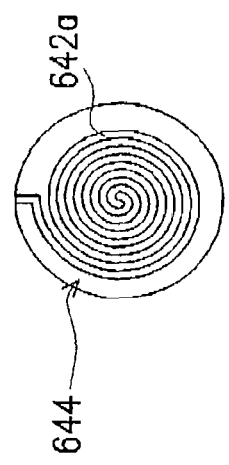
FIG. 11A is a schematic diagram of the formation of a passive device by a single layer of patterned wiring layer of the thin-film circuit layer.
Figure 11B:
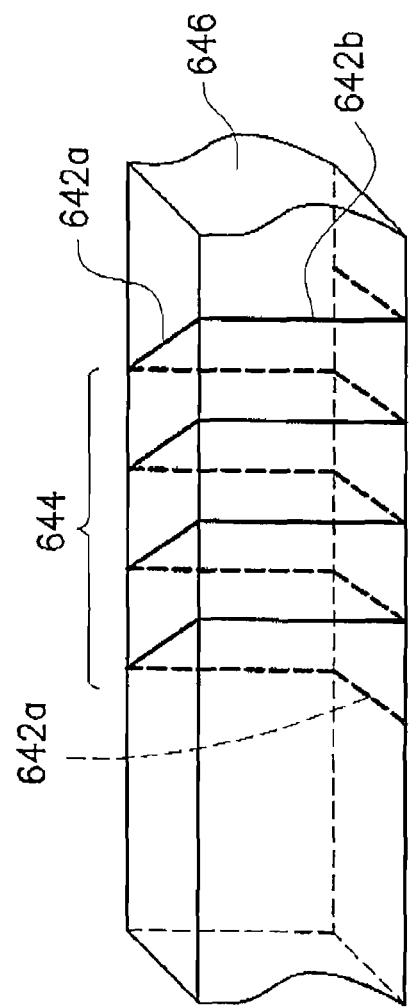
FIG. 11B is a schematic diagram of the formation of a passive device by a double layer of patterned wiring layer of the thin-film circuit layer.
Figure 11C:
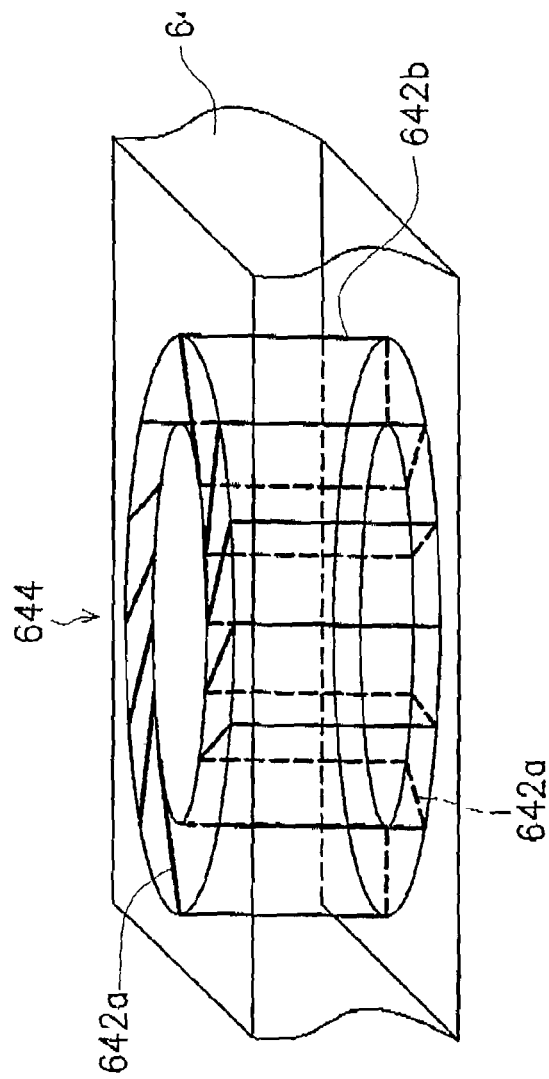
FIG. 11C is a schematic diagram of the formation of a passive device by a double layer of patterned wiring layer of the thin-film circuit layer.

Please continue to refer to FIG. 6, external circuitry 642 further comprises at least one passive device 644 including a capacitor, an inductor, a resistor, a wave-guide, a filter, a micro electronic mechanical sensor (MEMS), or the like. Passive device 644 can be located on a single layer of patterned wiring layer 642a or between two layers of patterned wiring layers 642a. In FIGS. 9A, 9B, passive device 644 can be formed by printing or other method on two bonding points on patterned wiring layer 642a when forming thin-film layer 640. In FIG. 10A, a comb-shape passive device 644 (such as a comb capacitor) is formed directly on a single patterned wiring layer. In FIG. 10B, passive device 644 (such as a capacitor) is formed between two layers of patterned wiring layers 642a with an insulating material 646 in between. Wherein the original dielectric layer (not shown) can replace insulating material 646. In FIG. 11A, passive device 644 (such as an inductor) is formed by making a single layer of patterned wiring layer 642a into a circular or square (not shown) spiral. In FIG. 11B, column-shape passive device 644 (such as an inductor) is formed by using two layers of patterned wiring layers 642a and a plurality of vias 642b to surround an insulating material 646 forming a column. In FIG. 11C, circular-shaped passive device 644 (such as an inductor) is formed by using slanted traces from two layers of patterned wiring layers and a plurality of vias 642b to surround an insulating material 646 in a circular manner forming a pie. The above structures allow the original externally welded passive devices to be integrated into the inside of the chip package structure.

Figure 7:
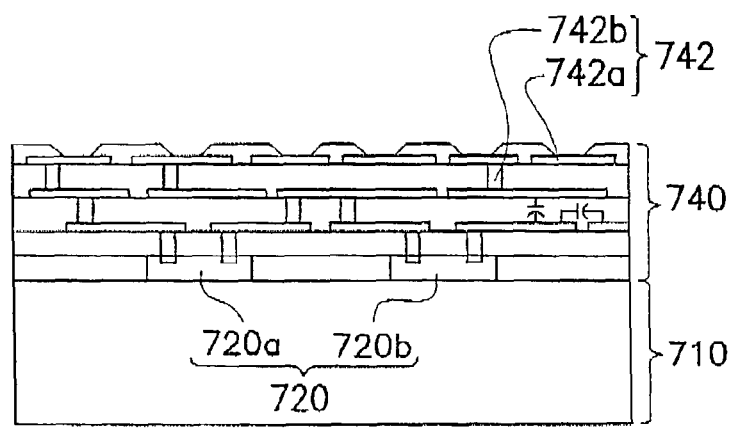
FIG. 7 is a schematic diagram showing the section view of the chip package structure of a preferred embodiment of the present invention with a plurality of dies.

FIG. 6 illustrates a chip package structure 600 for a single die 620 but FIG. 7 illustrates a chip package structure 700 for a plurality of dies. Chip package structure 700 in FIG. 7 differs from chip package structure 600 in FIG. 6 by having a die module 720, which comprises at least one or more dies such as die 720a, 720b. Die 720a, 720b are electrically connected by the external circuitry of the thin-film circuit layer. The function of die 720a, 720b can be the same or different and can be integrated together by external circuitry 742 to form a multi-die module (MCM) by packaging same or different dies into one chip package structure. When multiple dies are packaged into the same chip package structure, singulation process is performed on the determined number of dies.

Following the above, the present invention provides a chip packaging method by adhering a die to a ceramic substrate or to an inwardly protruded area of a ceramic substrate, and forming a thin-film circuit layer with bonding pads and points above the die and ceramic substrate. This structure can fan out the metal pads on the die to achieve a thin chip package structure with high pin count.

Comparing to the BGA or PGA package technique used in the prior art, the chip package of the present invention is performed directly on the die and the ceramic substrate for fanning out the metal pads on the die. It does not require flip chip or wire bonding to connect the die to the micro-spaced contact points of a package substrate or carrier. The present invention can reduce cost because the package substrate with micro-spaced contacts is very expensive. Moreover the signal transmission path of the present invention is reduced to lessen the effect of signal delay and attenuation, which improves the performance of the die.

Furthermore, the present invention uses ceramic substrate with high structural rigidity, high anti-corrosive properties, high density, and high thermal conductivity, which means that the package structure can be used in unfavorable environments such as high-corrosive, high humidity, or high temperature environment. The high CTE of ceramic material will help the die dissipate heat to improve performance. Furthermore, ceramic-BGA (CBGA) is already well know in the skilled of the art, which can be adapted to current machines to manufacture the ceramic substrate of the present invention for lower cost.

Furthermore, the third embodiment of the present invention provides an integrated substrate comprises a ceramic layer and a heat conducting layer. A plurality of openings can be pre-formed on the ceramic layer so inwardly protruded areas are formed for inlaying the die when the ceramic layer overlaps the heat conducting layer. The heat conducting layer helps to dissipate heat to the outside from the die during operation, which will effectively increase performance.

The thin-film layer circuit of the present invention is used to transmit signals between two main active devices inside the die, or used as a power/ground bus, or used to add in passive devices. Furthermore, the chip package structure of the present invention can accommodate one or more dies with similar or different functions. The external circuitry of the thin-film circuit layer electrically connects the multiple dies together and can be used in a MCM package. The chip package structure of the present invention adapts the MCM, the external circuitry of the thin-film circuit layer, the passive devices of the external circuitry to form a package that is "system in package".

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip packaging method comprising:
joining a die and a substrate;
thinning said die;
after joining said die and said substrate, forming an opening in said substrate and exposing said die; and
forming a metal layer on said substrate and forming a via in said opening, said metal layer coupled to said die through said via in said substrate.

2. The method of claim 1, further comprising forming an insulation layer around said die.

3. The method of claim 2, wherein said insulation layer comprises polymer.

4. The method of claim 2, wherein said insulation layer comprises oxide.

5. The method of claim 2, wherein said insulation layer comprises epoxy.

6. The method of claim 1, wherein said substrate comprises organic material.

7. The method of claim 1, further comprising thinning said substrate.

8. The method of claim 7, wherein said thinning said substrate comprises grinding said substrate.

9. The method of claim 7, wherein said thinning said substrate is performed until said substrate has a thickness between 2 µm and 200 µm.

10. The method of claim 7, wherein said thinning said die is followed by said thinning said substrate.

11. The method of claim 1, wherein said thinning said die comprises grinding said die.

12. The method of claim 1, wherein said substrate comprises ceramic material.

13. The method of claim 1, wherein said metal layer is formed using a process comprising sputtering.

14. The method of claim 1, wherein said metal layer is formed using a process comprising electroplating.

15. The method of claim 1, after forming said metal layer on said substrate, further comprising forming a bump on said metal layer, wherein said bump comprises gold.

16. The method of claim 1, after forming said metal layer on said substrate, further comprising forming a solder bump on said metal layer.

17. The method of claim 1, after forming said metal layer on said substrate, further comprising performing a singularizing process to form multiple chip package structures.

18. The method of claim 17, wherein one of said chip package structures comprises only one of said die.

19. The method of claim 17, wherein one of said chip package structures comprises a plurality of said die.

20. The method of claim 1, wherein said metal layer is formed using a process comprising electroless plating.

21. The method of claim 1, wherein said opening is formed using a process comprising drilling.

22. The method of claim 1, wherein said opening is formed using a process comprising etching.

23. The method of claim 1, wherein said substrate comprises glass material.

24. The method of claim 1, after forming said metal layer on said substrate, further comprising forming an insulation layer on said metal layer.

25. The method of claim 24, wherein said insulation layer comprises polyimide, benzocyclobutene, porous dielectric material, or stress buffer material.

26. The method of claim 1, after forming said metal layer on said substrate, further comprising forming an insulation layer on said metal layer and forming a first metal layer on said insulation layer, said first metal layer coupled to said metal layer through a via in said insulation layer.

27. The method of claim 26, wherein said insulation layer comprises polyimide, benzocyclobutene, porous dielectric material, or stress buffer material.

28. The method of claim 1, further comprising forming a passive device on said substrate.

29. The method of claim 28, wherein said passive device comprises a capacitor, a resistor, an inductor, a filter, a wave guide, or a micro electronic mechanical sensor (MEMS).

30. The method of claim 1, after thinning said die, further comprising joining said die and a carrier.

31. The method of claim 30, wherein said carrier comprises ceramic material.

32. The method of claim 1, wherein said joining said die and said substrate comprises joining a plurality of said die and said substrate, said metal layer comprising an interconnect coupled to multiple of said plurality of said die.

33. The method of claim 1, wherein said metal layer comprises a power bus or a ground bus.

34. The method of claim 1, wherein said die comprises a thin-film circuit layer formed therein, said metal layer having a thickness greater than that of said thin-film circuit layer.

35. The method of claim 1, wherein said metal layer comprises an interconnect connecting multiple portions of said die.

36. The method of claim 1, wherein said metal layer comprises copper.

\* \* \* \* \*